(12) United States Patent
Yang et al.

(10) Patent No.: US 11,699,488 B2
(45) Date of Patent: *Jul. 11, 2023

(54) DEVICE-REGION LAYOUT FOR EMBEDDED FLASH

(71) Applicant: Taiwan Semiconductor Manufacturing Company, Ltd., Hsin-Chu (TW)

(72) Inventors: Shih Kuang Yang, Tainan (TW); Ping-Cheng Li, Kaohsiung (TW); Hung-Ling Shih, Tainan (TW); Po-Wei Liu, Tainan (TW); Wen-Tuo Huang, Tainan (TW); Yu-Ling Hsu, Tainan (TW); Yong-Shiuan Tsair, Tainan (TW); Chia-Sheng Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/506,904

(22) Filed: Oct. 21, 2021

(65) Prior Publication Data

US 2022/0044729 A1 Feb. 10, 2022

Related U.S. Application Data

(60) Continuation of application No. 16/952,411, filed on Nov. 19, 2020, now Pat. No. 11,158,377, which is a
(Continued)

(51) Int. Cl.
*G11C 16/08* (2006.01)
*G11C 11/16* (2006.01)
(Continued)

(52) U.S. Cl.
CPC .......... *G11C 16/08* (2013.01); *G11C 11/1657* (2013.01); *H10B 12/053* (2023.02); *H10B 41/30* (2023.02)

(58) Field of Classification Search
CPC . G11C 16/08; G11C 11/1657; G11C 16/0433; H01L 27/10876; H01L 27/11521;
(Continued)

(56) References Cited

U.S. PATENT DOCUMENTS 9,287,280 B2  3/2016  Tsao et al.
9,842,844 B2  12/2017  Wu et al.
(Continued)

FOREIGN PATENT DOCUMENTS

JP  2014203898 A  10/2014

OTHER PUBLICATIONS

Notice of Allowance dated Aug. 21, 2020 for U.S. Appl. No. 16/400,361.
(Continued)

*Primary Examiner* — Allison Bernstein
(74) *Attorney, Agent, or Firm* — Eschweiler & Potashnik, LLC

(57) ABSTRACT

Various embodiments of the present application are directed towards an integrated memory chip with an enhanced device-region layout for reduced leakage current and an enlarged word-line etch process window (e.g., enhanced word-line etch resiliency). In some embodiments, the integrated memory chip comprises a substrate, a control gate, a word line, and an isolation structure. The substrate comprises a first source/drain region. The control gate and the word line are on the substrate. The word line is between and borders the first source/drain region and the control gate and is elongated along a length of the word line. The isolation structure extends into the substrate and has a first isolation-
(Continued)

structure sidewall. The first isolation-structure sidewall extends laterally along the length of the word line and underlies the word line.

20 Claims, 15 Drawing Sheets

Related U.S. Application Data division of application No. 16/400,361, filed on May 1, 2019, now Pat. No. 10,861,553.

(60) Provisional application No. 62/737,288, filed on Sep. 27, 2018.

(51) Int. Cl.
 *H10B 12/00* (2023.01)
 *H10B 41/30* (2023.01)

(58) Field of Classification Search
 CPC ......... H01L 27/11531; H01L 29/40114; H01L 29/42328; H01L 27/11519; H01L 27/115; H01L 27/0611; H01L 27/11526; H01L 27/11548; H10B 12/053; H10B 41/30; H10B 41/42; H10B 41/10; H10B 69/00; H10B 41/40; H10B 41/50
 See application file for complete search history.

(56) References Cited

U.S. PATENT DOCUMENTS

| | | | |
|---|---|---|---|
| 10,943,913 B2* | 3/2021 | Huang | ............. H01L 27/11521 |
| 2011/0115000 A1 | 5/2011 | Yang | |
| 2015/0333082 A1 | 11/2015 | Chuang et al. | |
| 2016/0190146 A1 | 6/2016 | Zhang et al. | |
| 2016/0307911 A1 | 10/2016 | Wu et al. | |
| 2017/0110469 A1 | 4/2017 | Yi et al. | |
| 2018/0151581 A1 | 5/2018 | Wu et al. | |
| 2018/0182772 A1 | 6/2018 | Lin et al. | |
| 2018/0233509 A1 | 8/2018 | Cai et al. | |
| 2020/0098877 A1 | 3/2020 | Hsu et al. | |
| 2020/0105775 A1 | 4/2020 | Huang et al. | |

OTHER PUBLICATIONS

Notice of Allowance dated Jun. 25, 2021 for U.S. Appl. No. 16/952,411.

* cited by examiner

DEVICE-REGION LAYOUT FOR EMBEDDED FLASH

REFERENCE TO RELATED APPLICATIONS

This application is a Continuation of U.S. application Ser. No. 16/952,411, filed on Nov. 19, 2020, which is a Divisional of U.S. application Ser. No. 16/400,361, filed on May 1, 2019 (now U.S. Pat. No. 10,861,553, issued on Dec. 8, 2020), which claims the benefit of U.S. Provisional Application No. 62/737,288, filed on Sep. 27, 2018. The contents of the above-referenced patent applications are hereby incorporated by reference in their entirety.

BACKGROUND

Embedded flash is flash memory that is integrated with logic devices on a common integrated circuit (IC) chip. The integration improves performance by eliminating interconnect structures between chips and reduces manufacturing costs by sharing process steps between the flash memory and the logic devices. Some types of flash memory include stacked gate flash memory and split gate flash memory. Split gate flash memory has lower power consumption, higher injection efficiency, less susceptibility to short channel effects, and over erase immunity compared to stacked gate flash memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
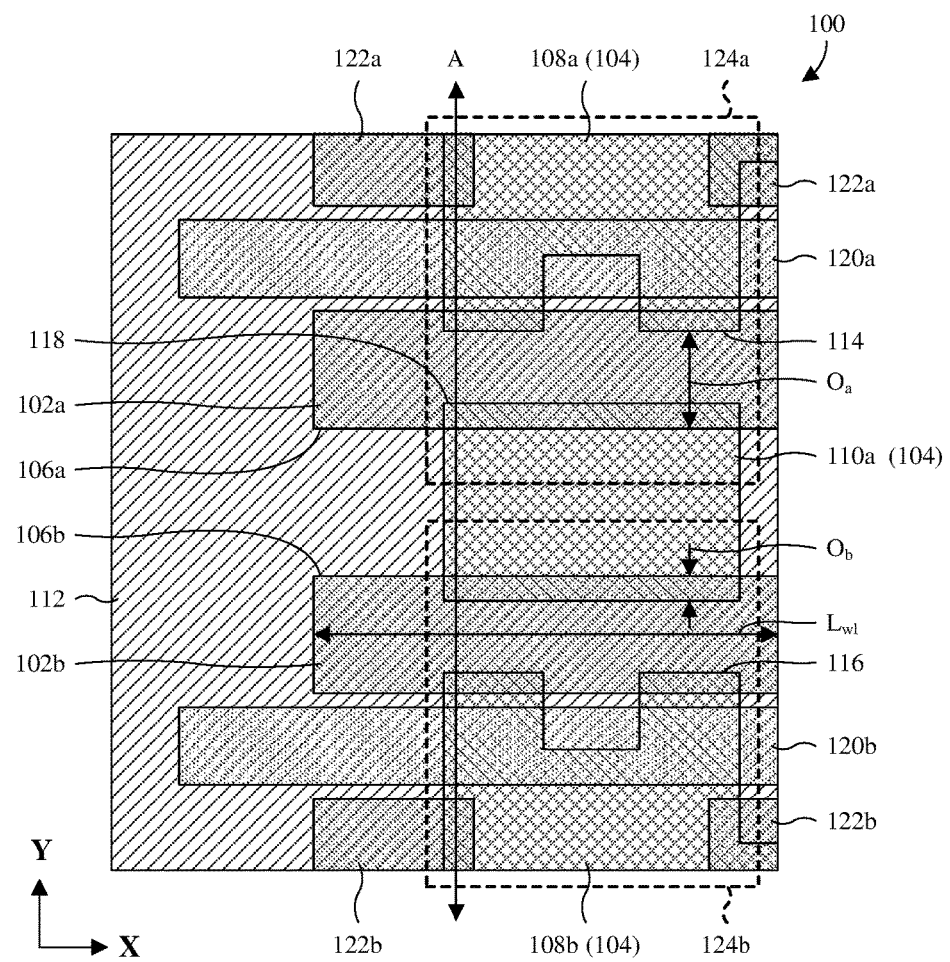
FIG. 1 illustrates a top layout of some embodiments of an integrated memory chip comprising an enhanced device-region layout according to aspect of the present application.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device may, for example, comprise a substrate, a first word line, a second word line, a first source/drain region, and a second source/drain region. The first and second word lines overlie a device region of the substrate and are elongated in parallel along respective word-line lengths. The device region is demarcated by an isolation structure and has a first device-region protrusion and a second device-region protrusion. The first device-region protrusion protrudes across the first word line in a direction crosswise to the word-line lengths and terminates at a first device-region sidewall of the substrate. The second device-region protrusion protrudes across the second word line in a direction crosswise to the word-line lengths and terminates at a second device-region sidewall of the substrate. The first and second device-region sidewalls adjoin the isolation structure and are laterally between and laterally spaced from the first and second word lines. The first and second source/drain regions are on the device region, respectively at the first and second device-region sidewalls. Further, the first and second source/drain regions are between and respectively border the first and second word lines.

During formation of the memory device, etching and/or cleaning processes recess a portion of the isolation structure at the first and second device-region sidewalls to below a top surface of the substrate, thereby defining a recess exposing the first and second device-region sidewalls. A challenge is that silicide may form on the first and second device-region sidewalls during a silicide process performed after forming the first and second word lines. The silicide may, in turn, result in leakage paths to a bulk of the substrate from the first and second source/drain regions. Further, during use of the memory device, the leakage paths may extend to source lines of the memory device along selectively-conductive channels underlying the first and second word lines. This extension may lead to read and/or write failure. Another challenge is that the recess decreases an etch process window (e.g., etch resiliency) during formation of the first and second word lines. Forming the first and second word lines may, for example, comprise: depositing a conductive layer; depositing an anti-reflective coating (ARC) on the conductive layer; and performing an etch into the ARC and the conductive layer with a photoresist mask in place to form a word-line pattern in the ARC and the conductive layer. Because of the recess, the conductive layer may be indented at the recess and the ARC may have an increased thickness at the recess. The increased thickness leads to increased etch loading, such that it takes longer to etch through a portion of the ARC at the recess than other portions of the ARC. As a result, the word-line pattern may not be accurately formed in the conductive layer. Conductive etch residue may persist and define a leakage path between the first and second word lines, thereby leading to failure of memory cells along the first and second word lines.

Various embodiments of the present application are directed towards an integrated memory chip with an enhanced device-region layout for reduced leakage current and an enlarged word-line etch process window (e.g., enhanced word-line etch resiliency). In some embodiments, the integrated memory chip comprises a substrate, a first word line, a second word line, and a source/drain region. The first and second word lines overlie a first device region of the substrate and a second device region of the substrate, and are elongated in parallel along respective word-line lengths. The first and second device regions are demarcated, and electrically separated from each other, by an isolation structure. The second device region is between and borders the first and second word lines. The first device region wraps around the second device region and has a first device-region protrusion and a second device-region protrusion respectively on opposite sides of the second device region. The first device-region protrusion protrudes under the first word line in a first direction crosswise to the word-line lengths and terminates at a first device-region sidewall of the substrate. The second device-region protrusion protrudes under the second word line in a second direction crosswise to the word-line lengths and terminates at a second device-region sidewall of the substrate. The first and second device-region sidewalls adjoin the isolation structure and face the second device region. Further, the first and second device-region sidewalls respectively underlie the first and second word lines. The source/drain region is on the second device region and is between and borders the first and second word lines.

During formation of the memory device, etching and/or cleaning processes may, for example, recess portions of the isolation structure at the first and second device-region sidewalls, thereby defining a first recess portion and a second recess portion respectively exposing the first and second device-region sidewalls. Because the first and second word lines overlie the first and second device-region sidewalls, the first and second word lines may, for example, fill the first and second recess portions and cover the first and second device-region sidewalls. This may, for example, prevent silicide from forming on the first and second device-region sidewalls during a silicide process performed after forming the first and second word lines. By preventing silicide from forming on the first and second device-region sidewalls, leakage paths to a bulk of the substrate may be prevented from forming and yields may be enhanced.

During formation of the first and second word lines, a conductive layer and an ARC may, for example, be sequentially deposited. Further, an etch may, for example, be performed into the ARC and the conductive layer to form the first and second word lines. While performing the etch, a portion of the conductive layer and a portion of the ARC on the second device region are removed, thereby defining opposing sidewalls respectively of the first and second word lines. Because the second device region is a different material than the isolation structure, the second device region is not subject to the recessing of the isolation structure and hence has a planar or substantially planar top surface. Accordingly, the conductive layer and the ARC each form with a uniform or substantially uniform thickness and a planar or substantially planar top surface at the second device region. This leads to uniform or substantially uniform etch loading at the second device region. The uniform or substantially uniform etch loading reduces the likelihood of etch residue remaining and electrically shorting the first and second word lines together. Hence, the uniform or substantially uniform etch loading may enlarge the process window (e.g., resiliency) of the etch.

With reference to FIG. 1, a top layout 100 of some embodiments of an integrated memory chip comprising an enhanced device-region layout is provided. As seen hereafter, the enhanced device-region layout is "enhanced" in that it may lead to reduced leakage current and/or an enlarged word-line etch process window. A first word line 102a and a second word line 102b are on a substrate 104 and are elongated in parallel along respective word-line lengths $L_{w1}$. Note that only one of the word-line lengths $L_{w1}$ is labeled. The first word line 102a has a first word-line sidewall 106a facing the second word line 102b, and the second word line 102b has a second word-line sidewall 106b facing the first word line 102a. The substrate 104 may be or comprise, for example, a bulk monocrystalline silicon substrate, a silicon-on-insulator (SOI) substrate, or some other suitable semiconductor substrate.

The substrate 104 has a first erase-side device region 108a, a second erase-side device region 108b, and a word-line-side device region 110a. The first and second erase-side device regions 108a, 108b and the word-line-side device region 110a correspond to top regions of the substrate 104 (when viewed in cross section) that are surrounded and demarcated by an isolation structure 112. The isolation structure 112 provides electrical and physical isolation between the first and second erase-side device regions 108a, 108b and the word-line-side device region 110a. The isolation structure 112 may be or comprise, for example, silicon oxide and/or some other suitable dielectric material(s) and/or may be or comprise, for example, a shallow trench isolation (STI) structure or some other suitable isolation structure.

The first erase-side device region 108a protrudes towards the first word line 102a in a first direction crosswise to the word-line lengths $L_{w1}$ and terminates at first device-region sidewalls 114. Similarly, the second erase-side device region 108b protrudes towards the second word line 102b in a second direction crosswise to the word-line lengths $L_{w1}$ and terminates at second device-region sidewalls 116. Note that only one of the first device-region sidewalls 114 is labeled 114 and only one of the second device-region sidewalls 116 is labeled 116. The first and second device-region sidewalls 114, 116 respectively underlie the first and second word lines 102a, 102b and are offset respectively from the first and second word-line sidewalls 106a, 106b by a first offset $O_a$. In some embodiments, the first and second erase-side device regions 108a, 108b are independent of each other. In other embodiments, the first and second erase-side device regions 108a, 108b are connected outside the illustrated portion of the integrated memory chip and are hence one and the same.

The word-line-side device region 110a is between the first and second erase-side device regions 108a, 108b and has a pair of third device-region sidewalls 118. Note that only one of the third device-region sidewalls 118 is labeled. The third device-region sidewalls 118 are respectively on opposite sides of the word-line-side device region 110a and respectively face the first and second erase-side device regions 108a, 108a. Further, the third device-region sidewalls 118 respectively underlie the first and second word lines 102a, 102b and are offset respectively from the first and second word-line sidewalls 106a, 106b by a second offset Ob less than the first offset $O_a$. In alternative embodiments, the third device-region sidewalls 118 are laterally between and spaced from the first and second word lines 102a, 102b, such that the third device-region sidewalls 118 do not underlie the first and second word lines 102a, 102b (e.g., the second offset Ob is negative). The word-line-side device region 110a may, for example, have a top layout that is square, rectangular, or some other suitable shape.

During formation of the integrated memory chip, etching and/or cleaning processes may, for example, recess portions of the isolation structure 112 at the first and second device-region sidewalls 114, 116, thereby exposing the first and second device-region sidewalls 114, 116. Because the first and second word lines 102a, 102b overlie the first and second device-region sidewalls 114, 116, the first and second word lines 102a, 102b may, for example, prevent silicide from forming on the first and second device-region sidewalls 114, 116 during a silicide process performed after forming the first and second word lines 102a, 102b. This, in turn, may prevent leakage paths to a bulk of the substrate 104 and may enhance yields.

In some embodiments, the first offset $O_a$ is between about 10-150 nanometers, about 10-80 nanometers, or about 80-150 nanometers. Other values for the first offset $O_a$ are, however, amenable. If the first offset $O_a$ is too small (e.g., less than about 10 nanometers or some other suitable value), the first and second device-region sidewalls 114, 116 may still be exposed during a silicide process performed after forming the first and second word lines 102a, 102b. For example, the etching and/or cleaning processes that recess the first and second word lines 102a, 102b may laterally etch the isolation structure 112 at the first and second device-region sidewalls 114, 116. The lateral etching may undercut the first and second word lines 102a, 102b and expose the first and second device-region sidewalls 114, 116 if the first offset $O_a$ is too small. If the first offset $O_a$ is too large (e.g., greater than about 150 nanometers or some other suitable value), the first and second word lines 102a, 102b would be oversized since the first and second device-region sidewalls 114, 116 underlie the first and second word lines 102a, 102b. As such, material would be wasted and a memory-array size would be larger than needed.

During formation of the first and second word lines 102a, 102b, a conductive layer and an ARC may, for example, be sequentially deposited. Further, an etch may, for example, be performed into the ARC and the conductive layer to form the first and second word lines 102a, 102b. While performing the etch, a portion of the conductive layer and a portion of the ARC on the word-line-side device region 110a are removed, thereby defining the first and second word-line sidewalls 106a, 106b. Because the word-line-side device region 110a is a different material than the isolation structure 112, the word-line-side device region 110a is not subject to the recessing of the isolation structure 112 and has a planar or substantially planar top surface (when viewed in cross section). Accordingly, the conductive layer and the ARC each form with a uniform or substantially uniform thickness and a planar or substantially planar top surface at the word-line-side device region 110a. This leads to uniform or substantially uniform etch loading at the word-line-side device region 110a. The uniform or substantially uniform etch loading reduces the likelihood of etch residue remaining and electrically shorting the first and second word lines 102a, 102b together. Hence, the word-line-side device region 110a may enlarge the process window (e.g., resiliency) of the etch.

A first control gate 120a, a second control gate 120b, a first erase gate 122a, and a second erase gate 122b are on the substrate 104. The first control gate 120a and the first erase gate 122a are on the first erase-side device region 108a, and the first control gate 120a is between and borders the first erase gate 122a and the first word line 102a. Similarly, the second control gate 120b and the second erase gate 122b are on the second erase-side device region 108b, and the second control gate 120b is between and borders the second erase gate 122b and the second word line 102b. The first and second word lines 102a, 102b, the first and second control gates 120a, 120b, and the first and second erase gates 122a, 122b are elongated in parallel in a first dimension (e.g., an X dimension) and are further laterally spaced from each other in a second dimension (e.g., a Y dimension) transverse to the first dimension.

In some embodiments, the first and second erase gates 122a, 122b are discontinuous in the first dimension. In other embodiments, the first and second erase gates 122a, 122b are continuous in the first dimension. In some embodiments, the first and second word lines 102a, 102b are discontinuous in the first dimension. In other embodiments, the first and second word lines 102a, 102b are continuous in the first dimension. In some embodiments, the first and second word lines 102a, 102b, the first and second control gates 120a, 120b, and the first and second erase gates 122a, 122b are or comprise doped polysilicon, metal, some other suitable conductive material(s), or any combination of the foregoing.

In some embodiment, a first boundary cell 124a and a second boundary cell 124b are on the word-line-side device region 110a and are respectively on the first and second erase-side device regions 108a, 108b. The first boundary cell 124a is defined in part by the first word line 102a, the first control gate 120a, and the first erase gate 122a, whereas the second boundary cell 124b is defined in part by the second word line 102b, the second control gate 120b, and the second erase gate 122b. The first and second boundary cells 124a, 124b are unused or dummy cells at an edge or boundary of a memory array that offset memory and strap cells of the memory array from the edge or boundary. The first and second boundary cells 124a, 124b are unused because there is a large change in feature density at the edge or boundary of the memory array. This large change in feature density leads a high degree of process non-uniformity, whereby the first and second boundary cells 124a, 124b are non-uniform and hence unsuitable for use.

Figure 2A:
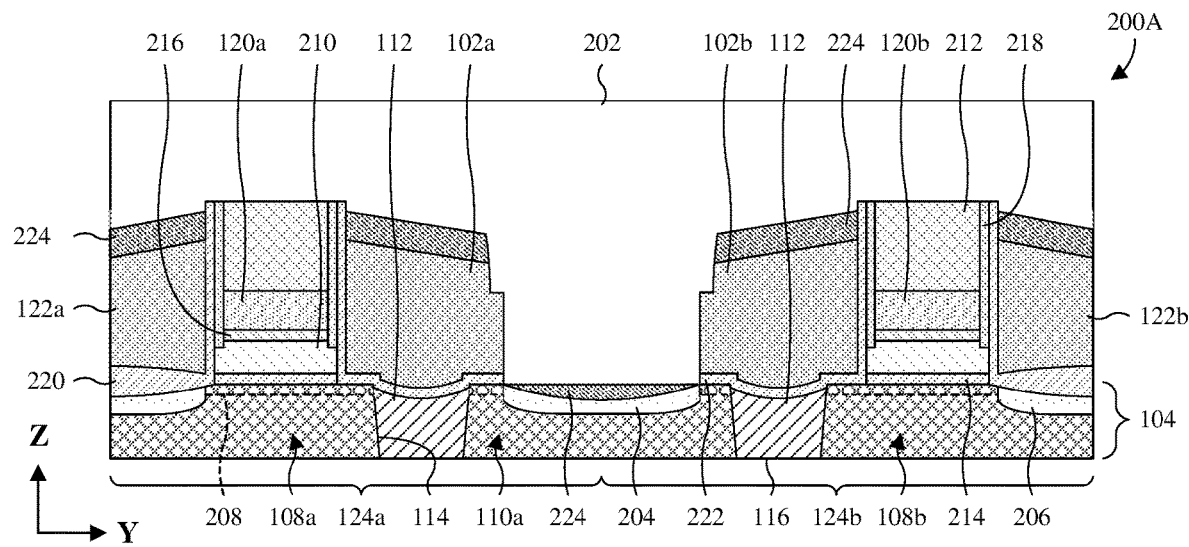
FIGS. 2A and 2B illustrate cross-sectional views of various embodiments of the integrated memory chip of FIG. 1.

With reference to FIG. 2A, a cross-sectional view 200A of some embodiments of the integrated memory chip of FIG. 1 is provided. The cross-sectional view 200A may, for example, be taken along line A in FIG. 1. The first and second word lines 102a, 102b, the first and second control gates 120a, 120b, and the first and second erase gates 122a, 122b are covered by an interconnect dielectric layer 202.

The interconnect dielectric layer 202 may be or comprise, for example, a low k dielectric and/or some other suitable dielectric(s).

Additionally, first and second word lines 102a, 102b, the first and second control gates 120a, 120b, and the first and second erase gates 122a, 122b overlie the substrate 104 and the isolation structure 112. The isolation structure 112 protrudes into a top of the substrate 104 to demarcate the first and second erase-side device regions 108a, 108b and the word-line-side device region 110a. In some embodiments, the first and second erase-side device regions 108a, 108b and/or the word-line-side device region 110a are active. A region of the substrate 104 may, for example, be active in that it undergoes depletion and/or enhancement during operation of the integrated memory chip and/or may, for example, be active in that current flows through the region during operation of the integrated memory chip.

A source/drain region 204 is on the word-line-side device region 110a and is between and borders the first and second word lines 102a, 102b. Multiple source lines 206 are respectively on the first and second erase-side device regions 108a, 108b and respectively underlie the first and second erase gates 122a, 122b. Note that only one of the source lines 206 is labeled. The source/drain region 204 and the source lines 206 are doped regions of the substrate 104. The source/drain regions 204 and the source lines 206 may, for example, share a doping type (e.g., p-type or n-type) and/or may, for example, have opposite doping types as adjoining regions of the substrate 104.

A plurality of selectively-conductive channels 208 is in the first and second erase-side device regions 108a, 108b and the word-line-side device region 110a. Note that only one of the selectively-conductive channels 208 is labeled. The selectively-conductive channels 208 extend along a top surface of the substrate 104 and underlie the first and second word lines 102a, 102b and the first and second control gates 120a, 120b. Further, the selectively-conductive channels 208 conduct depending upon bias voltages of the overlying gates (e.g., the first word line 102a). Because the isolation structure 112 electrically separates the source lines 206 from the source/drain region 204, the isolation structure 112 prevents the selectively-conductive channels 208 from electrically coupling the source/drain region 204 to the source lines 206.

The first and second control gates 120a, 120b overlie individual floating gates 210 and are covered by individual control-gate hard masks 212. The floating gates 210 are spaced from the substrate 104 by individual floating-gate dielectric layers 214 and are spaced from the first and second control gates 120a, 120b by individual control-gate dielectric layers 216. Note that only one of the floating gates 210, only one of the control-gate hard masks 212, only one of the floating-gate dielectric layers 214, and only one of the control-gate dielectric layers 216 are labeled. The floating gates 210 may be or comprise, for example, doped polysilicon and/or some other suitable conductive material(s). The floating-gate dielectric layers 214 may be or comprise, for example, silicon oxide and/or some other suitable dielectric (s). The control-gate hard masks 212 and/or the control-gate dielectric layers 216 may be or comprise, for example, silicon oxide, silicon nitride, some other suitable dielectric (s), or any combination of the foregoing.

The first and second control gates 120a, 120b are lined by individual control-gate sidewall spacers 218. Further, the first and second erase gates 122a, 122b are lined by individual erase-gate dielectric layers 220, and the first and second word lines 102a, 102b are lined by individual word-line dielectric layers 222. Note that only one of the control-gate sidewall spacers 218, only one of the erase-gate dielectric layers 220, and only one of the word-line dielectric layers 222 are labeled. The erase-gate dielectric layers 220 separate the first and second erase gates 122a, 122b from the floating gates 210, the control-gate sidewall spacers 218, and the substrate 104. The word-line dielectric layers 222 separate the first and second word lines 102a, 102b from the floating gates 210, the control-gate sidewall spacers 218, the substrate 104, and the isolation structure 112. The control-gate sidewall spacers 218 may be or comprise, for example, silicon oxide, silicon nitride, some other suitable dielectric (s), or any combination of the foregoing. The erase-gate dielectric layers 220 and/or the word-line dielectric layers 222 may be or comprise, for example, silicon oxide and/or some other suitable dielectric(s).

Silicide layers 224 respectively cover the first and second word lines 102a, 102b, the first and second erase gates 122a, 122b, and the source/drain region 204. Note that only some of the silicide layers 224 are labeled. The silicide layers 224 may, for example, be or comprise nickel silicide and/or some other suitable silicide. As seen hereafter, formation of the silicide layers 224 is performed after formation of the first and second word lines 102a, 102b. As such, the first and second device-region sidewalls 114, 116 are covered by the first and second word lines 102a, 102b and silicide cannot form on any portions of the first and second device-region sidewalls 114, 116 exposed during formation of the integrated memory chip. This, in turn, prevents leakage paths from extending along the first and second device-region sidewalls 114, 116, from corresponding ones of the selectively-conductive channels 208 to a bulk of the substrate 104.

Figure 2B:
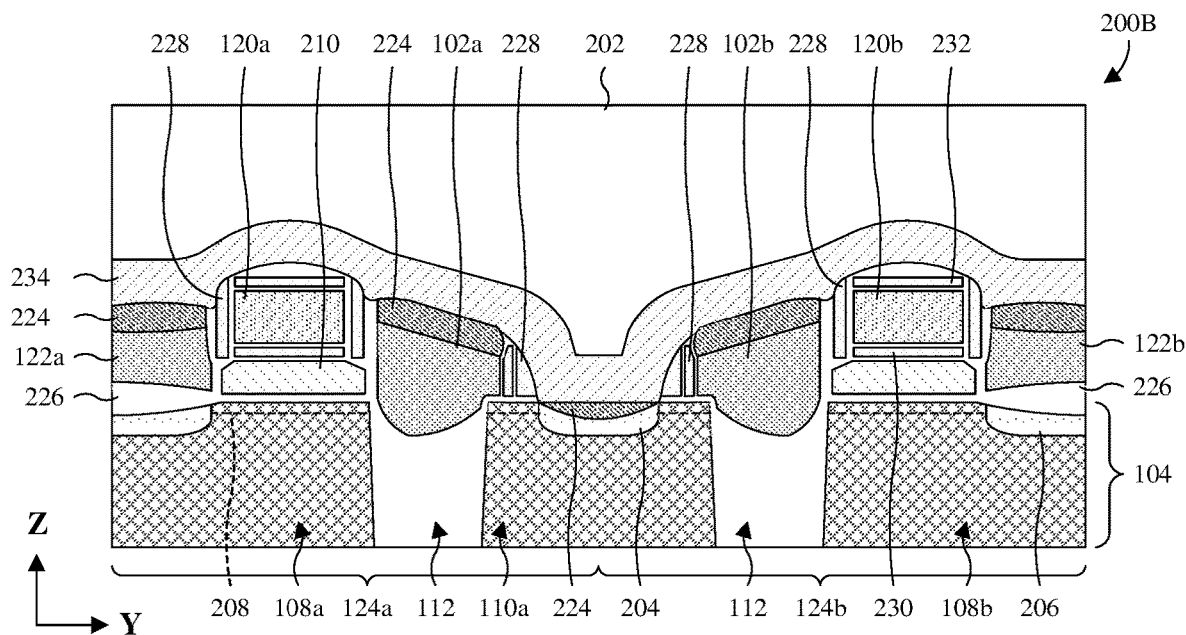

With reference to FIG. 2B, a cross-sectional view 200B of some alternative embodiments of the integrated memory chip of FIG. 2A is provided in which an inter-gate dielectric structure 226 separates the first and second word lines 102a, 102b, the first and second control gates 120a, 120b, and the first and second erase gates 122a, 122b from each other and the substrate 104. Further, the inter-gate dielectric structure 226 defines the isolation structure 112. The inter-gate dielectric structure 226 may be or comprise, for example, silicon oxide and/or some other suitable dielectric material(s).

Multiple sidewall spacers 228, multiple control-gate dielectric layers 230, and multiple control-gate hard masks 232 are in the inter-gate dielectric structure 226. Note that only some of the sidewall spacers 228, only one of the control-gate dielectric layers 230, and only one of the control-gate hard masks 232 are labeled. The sidewall spacers 228 are respectively on and/or along sidewalls of the first and second control gates 120a, 120b and the first and second word lines 102a, 102b. The control-gate dielectric layers 230 respectively overlie the floating gates 210, between the floating gates 210 and the first and second control gates 120a, 120b. The control-gate hard masks 212 respectively cover the first and second control gates 120a, 120b. The sidewall spacers 228, the control-gate dielectric layers 230, and the control-gate hard masks 232 may be or comprise, for example, silicon nitride and/or some other suitable dielectric(s). In some embodiments, the inter-gate dielectric structure 226 is or comprises silicon oxide, whereas the sidewall spacers 228, the control-gate dielectric layers 230, and the control-gate hard masks 232 are or comprise silicon nitride. Other materials are, however, amenable.

A contact etch stop layer 234 underlies the interconnect dielectric layer 202 and covers the first and second word lines 102a, 102b, the first and second control gates 120a, 120b, and the first and second erase gates 122a, 122b. During formation of the integrated memory chip, the contact etch stop layer 234 serves as an etch stop while etching contact-via openings in the interconnect dielectric layer 202. Note that no contact vias are shown in the cross-sectional view 200B. The contact etch stop layer 234 may be or comprise, for example, silicon carbide, silicon nitride, some other suitable dielectric(s), or any combination of the foregoing.

Figure 3A:
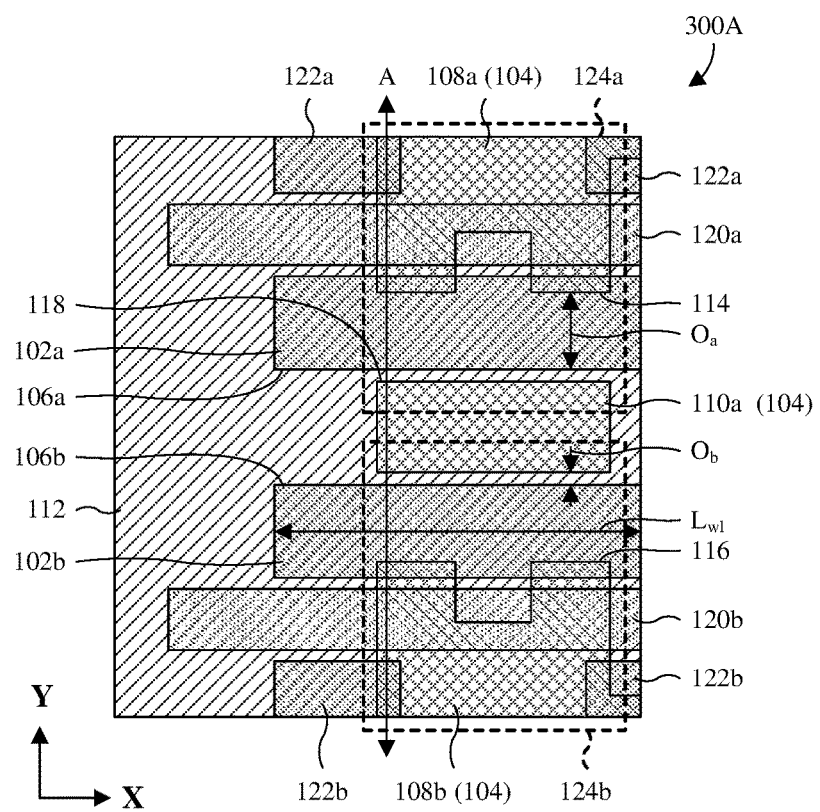
FIGS. 3A-3C illustrate top layouts of some alternative embodiments of the integrated memory chip of FIG. 1 in which the enhanced device-region layout is varied.
Figure 3B:
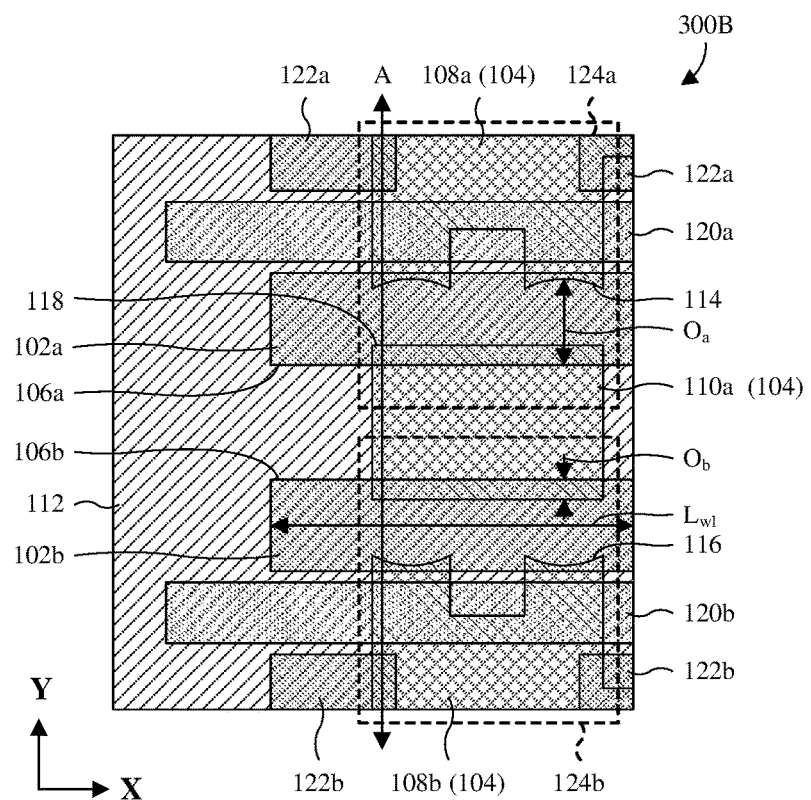
Figure 3C:
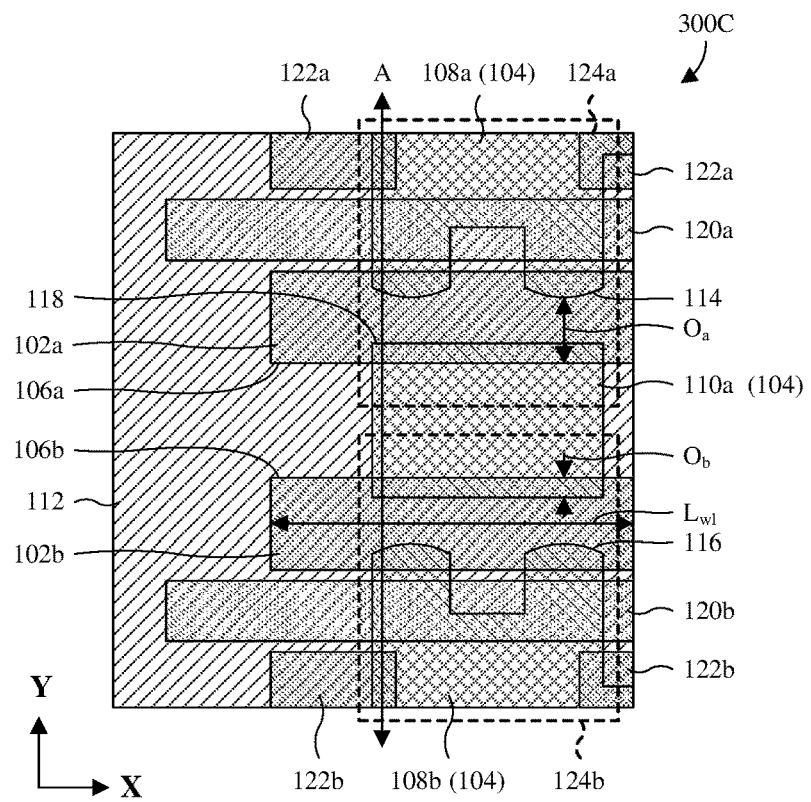

With reference to FIGS. 3A-3C, top layouts 300A-300C of some alternative embodiments of the integrated memory chip of FIG. 1 are provided in which the enhanced device-region layout is varied. As illustrated by the top layout 300A of FIG. 3A, the word-line-side device region 110a is laterally between and spaced from the first and second word lines 102a, 102b. Hence, the second offset Ob is negative in FIG. 3A, and positive in FIG. 1, or vice versa. As illustrated by the top layout 300B of FIG. 3B, the first device-region sidewalls 114 are curved so edges of the first device-region sidewalls 114 are farther from the first control gate 120a than centers of the first device-region sidewalls 114. Further, the second device-region sidewalls 116 are similarly curved. As illustrated by the top layout 300C of FIG. 3C, the first device-region sidewalls 114 are curved so edges of the first device-region sidewalls 114 are closer to the first control gate 120a than centers of the first device-region sidewalls 114. Further, the second device-region sidewalls 116 are similarly curved. While not shown, the word-line-side device region 110a may be laterally between and spaced from the first and second word lines 102a, 102b, as illustrated in FIG. 3A, in alternative embodiments of FIGS. 3B and 3C.

Figure 4A:
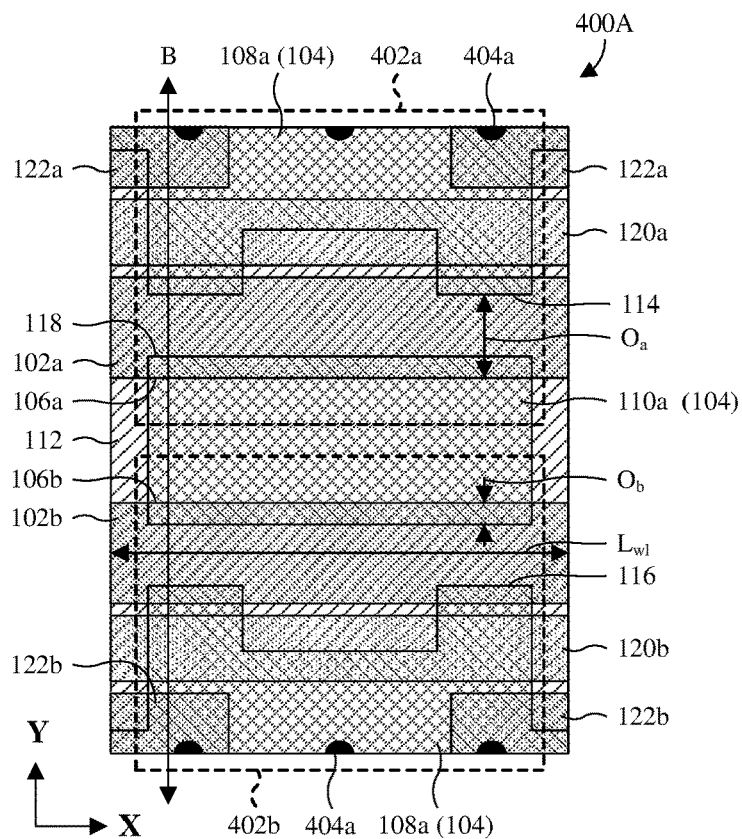
FIGS. 4A-4C illustrate top layouts of various embodiments of an integrated memory chip comprising a pair of strap cells with the enhanced device-region layout of FIG. 1.

With reference to FIG. 4A, a top layout 400A of some embodiments of an integrated memory chip comprising a pair of source-line/erase-gate (SLEG) strap cells with the enhanced device-region layout of FIG. 1 is provided. The pair of SLEG strap cells comprises a first SLEG strap cell 402a and a second SLEG strap cell 402b. The first and second SLEG strap cells 402a, 402b are on the word-line-side device region 110a and are respectively on the first and second erase-side device regions 108a, 108b. The first and second erase-side device regions 108a, 108b and the word-line-side device region 110a are as described in FIG. 1.

The first SLEG strap cell 402a is defined in part by the first word line 102a, the first control gate 120a, and the first erase gate 122a, whereas the second SLEG strap cell 402b is defined in part by the second word line 102b, the second control gate 120b, and the second erase gate 122b. In some embodiments, the first and second SLEG strap cell 402a, 402b have the same cross section or a similar cross section as the first and second boundary cells 124a, 124b of FIG. 1. Hence, the cross-sectional view 200A of FIG. 2A and/or the cross-sectional view 200B of FIG. 2B may, for example, be taken along line B in FIG. 4A.

The first and second SLEG strap cells 402a, 402b provide locations at which the first and second erase gates 122a, 122b are electrically coupled to erase-gate strap lines (not shown). Further, the first and second SLEG strap cells 402a, 402b provide locations at which source lines (not shown; see, e.g., the source lines 206 in FIGS. 2A and 2B) are electrically coupled to source-line strap lines (not shown). The electrical coupling from the first and second SLEG strap cells 402a, 402b to the erase-gate and source-line strap lines may, for example, be performed in part by a plurality of contact vias 404a on the first and second SLEG strap cells 402a, 402b. Note that only some of the contact vias 404a are labeled.

The erase-gate and source-line strap lines are elongated in parallel with the first and second erase gates 122a, 122b and the source lines. Further, the erase-gate and source-line strap lines have lower resistances than the first and second erase gates 122a, 122b and the source lines. Hence, electrically coupling the first and second erase gates 122a, 122b to the erase-gate strap lines at the first and second SLEG strap cells 402a, 402b, and other SLEG strap cells along the first and second erase gates 122a, 122b, reduces resistances and voltage drops along the first and second erase gates 122a, 122b. Further, electrically coupling the source lines to the source-line strap lines at the first and second SLEG strap cells 402a, 402b, and other SLEG strap cells along the source lines, reduces resistances and voltage drops along the source lines.

Figure 4B:
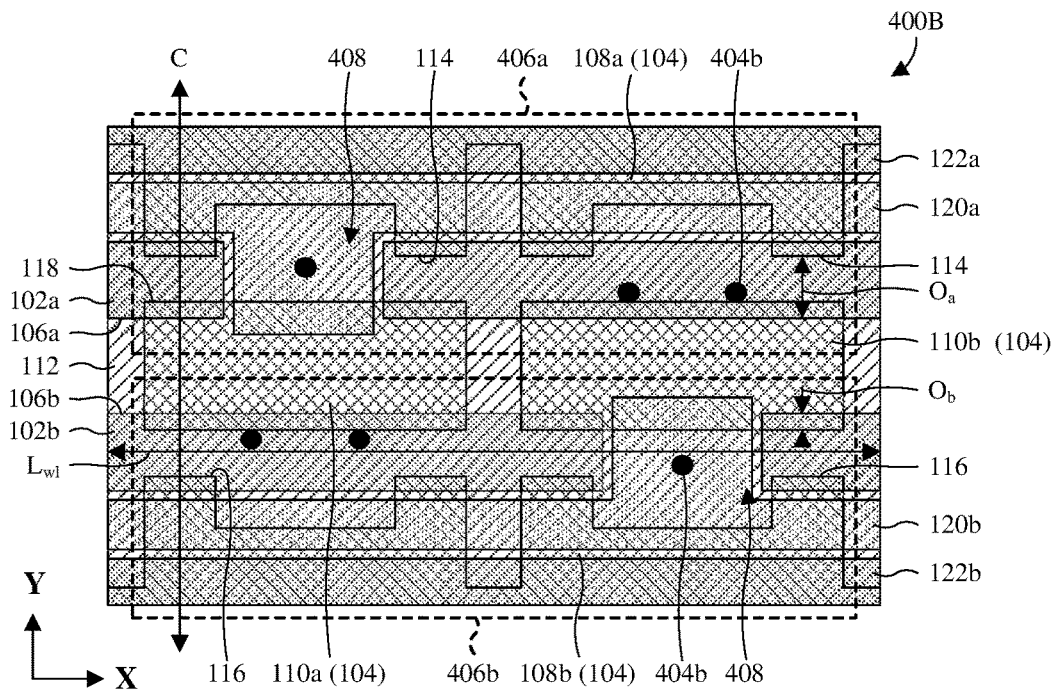

With reference to FIG. 4B, a top layout 400B of some embodiments of an integrated memory chip comprising a pair of control-gate/word-line (CGWL) strap cells with the enhanced device-region layout of FIG. 1 is provided. The pair of CGWL strap cells comprises a first CGWL strap cell 406a and a second CGWL strap cell 406b. The first and second CGWL strap cells 406a, 406b are on the word-line-side device region 110a and are respectively on the first and second erase-side device regions 108a, 108b. Further, the first and second CGWL strap cells 406a, 406b are on a second word-line-side device region 110b. The first and second erase-side device regions 108a, 108b and the word-line-side device region 110a are as described and illustrated in FIG. 1, except the first and second erase-side device regions 108a, 108b each protrude crosswise to the word-line lengths $L_{w1}$ at four or more locations (compared to two or more location in FIG. 1). Further, the second word-line-side device region 110b is as the word-line-side device region 110a is described and illustrated in FIG. 1.

The first CGWL strap cell 406a is defined in part by the first word line 102a, the first control gate 120a, and the first erase gate 122a, whereas the second CGWL strap cell 406b is defined in part by the second word line 102b, the second control gate 120b, and the second erase gate 122b. In some embodiments, the first and second CGWL strap cell 406a, 406b have the same cross section or a similar cross section as the first and second boundary cells 124a, 124b of FIG. 1. Hence, the cross-sectional view 200A of FIG. 2A and/or the cross-sectional view 200B of FIG. 2B may, for example, be taken along line C in FIG. 4B.

The first and second CGWL strap cells 406a, 406b provide locations at which the first and second control gates 120a, 120b are electrically coupled to control-gate strap lines (not shown). For example, the first and second control gates 120a, 120b may have pad regions 408 at the first and second CGWL strap cells 406a, 406b to electrically couple the first and second control gates 120a, 120b to the control-gate strap lines. Further, the first and second CGWL strap cells 406a, 406b provide locations at which the first and second word lines 102a, 102b are electrically coupled to word-line strap lines (not shown). The electrical coupling from the first and second CGWL strap cells 406a, 406b to the control-gate and word-line strap lines may, for example, be performed in part by a plurality of contact vias 404b on the first and second CGWL strap cells 406a, 406b. Note that only some of the contact vias 404b are labeled.

The control-gate and word-line strap lines are elongated in parallel with the first and second control gates 120a, 120b and the first and second word lines 102a, 102b. Further, the control-gate and word-line strap lines have lower resistances than the first and second control gates 120a, 120b and the first and second word lines 102a, 102b. Hence, electrically coupling the first and second control gates 120a, 120b to the control-gate strap lines at the first and second CGWL strap cells 406a, 406b, and other CGWL strap cells along the first and second control gates 120a, 120b, reduces resistances and voltage drops along the first and second control gates 120a, 120b. Further, electrically coupling the first and second word lines 102a, 102b to the word-line strap lines at the first and second CGWL strap cells 406a, 406b, and other CGWL strap cells along the first and second word lines 102a, 102b, reduces resistances and voltage drops along the first and second word lines 102a, 102b.

Figure 4C:
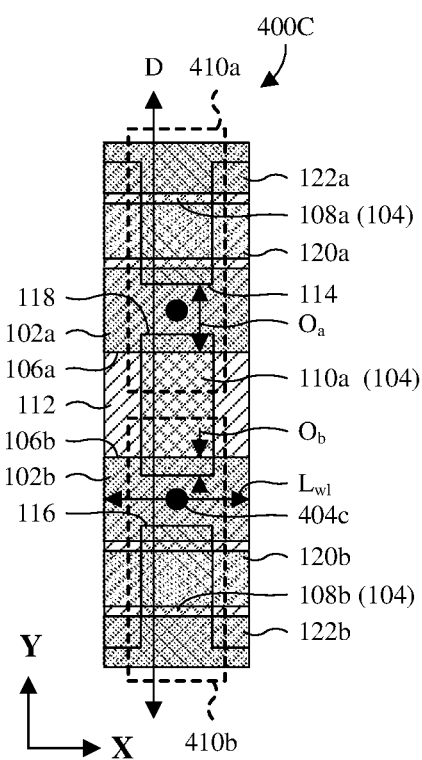

With reference to FIG. 4C, a top layout 400C of some embodiments of an integrated memory chip comprising a pair of word-line strap cells with the enhanced device-region layout of FIG. 1 is provided. The pair of word-line strap cells comprises a first word-line strap cell 410a and a second word-line strap cell 410b. The first and second word-line strap cells 410a, 410b are on the word-line-side device region 110a and are respectively on the first and second erase-side device regions 108a, 108b. The first and second erase-side device regions 108a, 108b and the word-line-side device region 110a are as described and illustrated in FIG. 1, except the first and second erase-side device regions 108a, 108b each protrude crosswise to the word-line lengths $L_{w1}$ at one or more locations (compared to two or more locations in FIG. 1).

The first word-line strap cell 410a is defined in part by the first word line 102a, the first control gate 120a, and the first erase gate 122a, whereas the second word-line strap cell 410b is defined in part by the second word line 102b, the second control gate 120b, and the second erase gate 122b. In some embodiments, the first and second word-line strap cells 410a, 410b have the same cross section or a similar cross section as the first and second boundary cells 124a, 124b of FIG. 1. Hence, the cross-sectional view 200A of FIG. 2A and/or the cross-sectional view 200B of FIG. 2B may, for example, be taken along line D in FIG. 4C.

The first and second word-line strap cells 410a, 410b provide locations at which the first and second word lines 102a, 102b are electrically coupled to word-line strap lines (not shown). The electrical coupling from the first and second word-line strap cells 410a, 410b to the control-gate and word-line strap lines may, for example, be performed in part by a plurality of contact vias 404c on the first and second word-line strap cells 410a, 410b. Note that only one of the contact vias 404c is labeled. The word-line strap lines are elongated in parallel with the first and second word lines 102a, 102b and have lower resistances than the first and second word lines 102a, 102b. Hence, electrically coupling the first and second word lines 102a, 102b to the word-line strap lines at the first and second word-line strap cells 410a, 410b, and other word-line strap cells along the first and second word lines 102a, 102b, reduces resistances and voltage drops along the first and second word lines 102a, 102b.

While FIGS. 4A-4C are illustrated using embodiments of the enhanced device-region layout in FIG. 1, it is to be understood that FIGS. 4A-4C may alternatively use embodiments of the enhanced device-region layout in any one or combination of FIGS. 3A-3C. For example, the first and second device-region sidewalls 114, 116 in FIGS. 4A-4C may be curved as illustrated in FIG. 3B or 3C. As another example, the word-line-side device region 110a of FIG. 4A and/or FIG. 4C may be laterally between and spaced from the first and second word lines 102a, 102b as illustrated in FIG. 3A. As yet another example, the word-line-side device region 110a of FIG. 4B and the second word-line-side device region 110b of FIG. 4B may each be laterally between and spaced from the first and second word lines 102a, 102b as illustrated in FIG. 3A.

Figure 5:
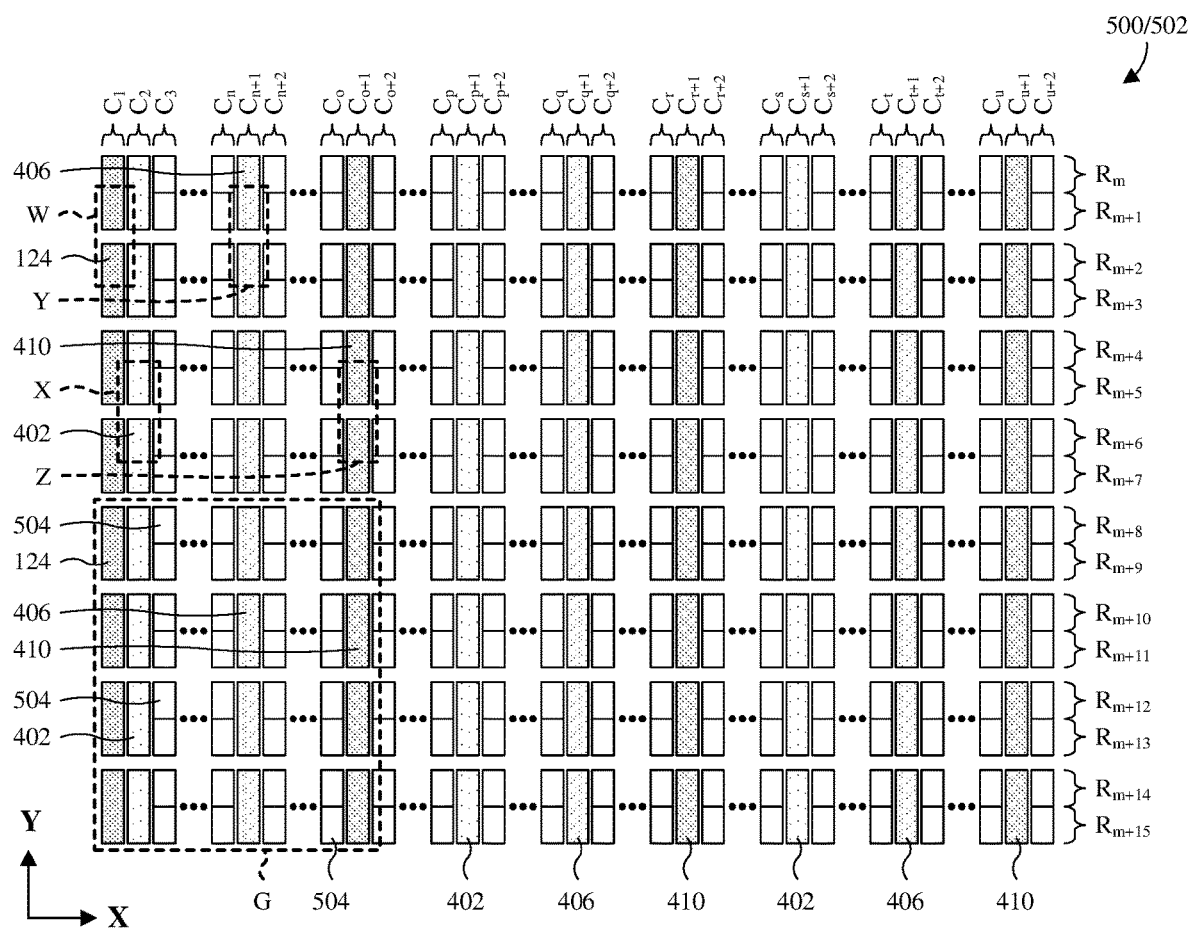
FIG. 5 illustrates a block diagram of some embodiments of an integrated memory chip comprising a memory array with boundary cells in FIG. 1 and/or the strap cells in any one or combination of FIGS. 4A-4C.

With reference to FIG. 5, a block diagram 500 of some embodiments of an integrated memory chip comprising a memory array 502 with the enhanced device-region layout of FIG. 1 is provided. The memory array 502 comprises a plurality of cells in a plurality of rows and a plurality of columns. For clarity, the rows are respectively labeled $R_m$ through $R_{m+15}$ and the columns are respectively labeled $C_1$ through $C_{u+2}$. The subscripts of the row labels identify corresponding row numbers, and the subscripts of the column labels identify corresponding column numbers. Further, m is an integer representing a row number in the memory array 502 and n through u are integers representing column numbers in the memory array 502. The plurality of cells comprises a plurality of boundary cells 124, a plurality of SLEG strap cells 402, a plurality of CGWL strap cell 406, a plurality of word-line strap cells 410, and a plurality of memory cells 504. Note that only some of each type of cell are labeled.

The boundary cells 124 are at a boundary of the memory array 502 (e.g., column $C_1$) and each span two rows. The boundary cells 124 may, for example, each be as the first and second boundary cells 124a, 124b of FIG. 1 are illustrated and described. Further, the first and second boundary cells 124a, 124b of FIG. 1 may, for example, be taken within box W and/or FIG. 1 may, for example, illustrate only portions of the first and second boundary cells 124a, 124b. As noted above, the boundary cells 124 are dummy cells at a boundary of a memory array that offset memory and strap cells from the boundary, thereby protecting the memory and strap cells from the large change in feature density at the boundary.

The SLEG strap cells 402, the CGWL strap cells 406, and the word-line strap cells 410 repeat periodically along each of the rows and each span two rows. For example, the SLEG strap cells 402 may be at columns $C_2$, $C_{p+1}$, and $C_{S+1}$, the CGWL strap cells 406 may be at columns $C_{n+1}$, $C_{q+1}$, and $C_{t+1}$, and the word-line strap cells 410 may be at columns $C_{o+1}$, $C_{r+1}$, and $C_{u+1}$. The SLEG strap cells 402 may, for example, each be as the first and second SLEG strap cells 402a, 402b of FIG. 4A are illustrated and described. Further, the first and second SLEG strap cells 402a, 402b of FIG. 4A may, for example, be taken within box X and/or FIG. 4A may, for example, illustrate only portions of the first and second SLEG strap cells 402a, 402b. The CGWL strap cells 406 may, for example, each be as the first and second CGWL strap cells 406a, 406b of FIG. 4B are illustrated and described. Further, the first and second CGWL strap cells 406a, 406b of FIG. 4B may, for example, be taken within box Y and/or FIG. 4B may, for example, illustrate only portions of the first and second CGWL strap cells 406a, 406b. The word-line strap cells 410 may, for example, each be as the first and second word-line strap cells 410a, 410b of FIG. 4C are illustrated and described. Further, the first and second word-line strap cells 410a, 410b of FIG. 4C may, for example, be taken within box Z and/or FIG. 4C may, for example, illustrate only portions of the first and second word-line strap cells 410a, 410b. As noted above, the strap cells electrically couple gates, word lines, and source lines to strap lines to reduce resistances and hence voltage drops along the gates, the word lines, and the source lines.

The memory cells 504 repeat along the rows and separate the strap cells (e.g., the word-line strap cells 410) from each other. For example, each strap cell may be separated from a neighboring strap cell along a corresponding row by 16 memory cells or some other suitable number of memory cells. The memory cells 504 may, for example, be or comprise third generation SUPERFLASH (ESF3) cells or some other suitable cells.

Figure 6A:
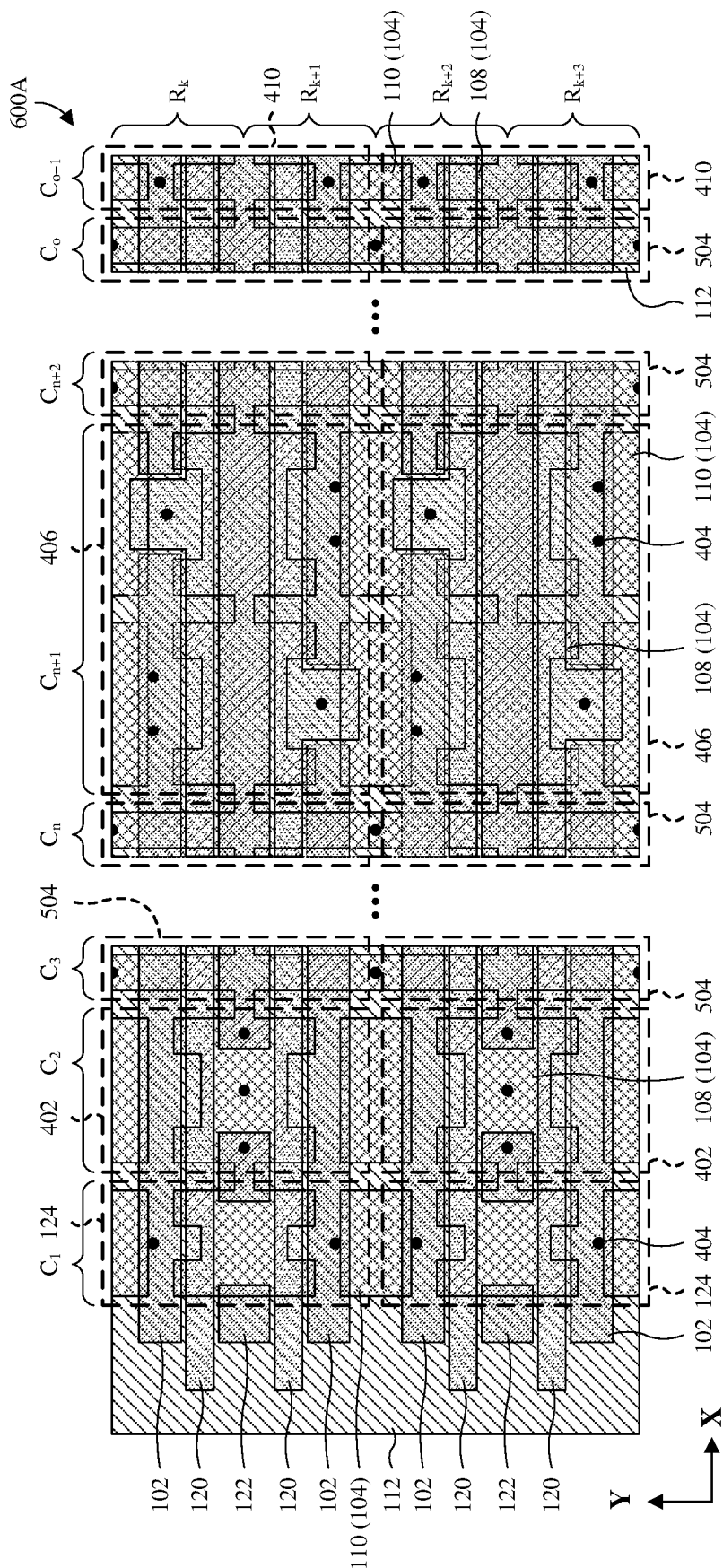
FIGS. 6A and 6B illustrate top layouts of various embodiments of an integrated memory chip comprising a boundary portion of the memory array of FIG. 5.

With reference to FIG. 6A, a top layout 600A of some embodiments of an integrated memory chip comprising a boundary portion of the memory array 502 of FIG. 5 is provided. The boundary portion may, for example, correspond to a top half of box G in FIG. 5 or a bottom half of box G in FIG. 5. A plurality of word lines 102, a plurality of control gates 120, and a plurality of erase gates 122 are on a substrate 104 and an isolation structure 112. The substrate 104 has an erase-side device region 108 and a plurality of word-line-side device regions 110. Note that only some of the word-line-side device regions 110 are labeled.

The erase-side device region 108 is laid out as described for the first and second erase-side device regions 108a, 108b of FIG. 1, such that the erase-side device region 108 protrudes crosswise to lengths of the word lines (e.g., in a Y dimension) and terminates at device-region sidewalls underlying the word lines 102. Similarly, the word-line-side device regions 110 are each laid out as described for the word-line-side device region 110a of FIG. 1, such that the word-line-side device regions 110 underlie neighboring word lines. By protruding to, and terminating at, device-region sidewalls underlying the word lines 102, the device-region sidewalls are covered by the word lines 102. This may, for example, prevent silicide from forming on the device-region sidewalls and hence may, for example, prevent leakage paths at the device-region sidewalls.

The word lines 102, the control gates 120, and the erase gates 122 are elongated in parallel in first dimension (e.g., an X dimension) and are spaced from each other in a second dimension (e.g., a Y dimension). Further, the word lines 102, the control gates 120, and the erase gates 122 partially define a plurality of cells. The word lines 102, the control gates 120, and the erase gates 122 may, for example, be as the first and second word lines 102a, 102b, the first and second control gates 120a, 120b, and the first and second erase gates 122a, 122b are described in any one or combination of FIGS. 1, 2A, 2B, 3A-3C, and 4A-4C.

The plurality of cells comprises boundary cells 124, SLEG strap cells 402, CGWL strap cells 406, word-line strap cells 410, and memory cells 504. Note that only some of the memory cells 504 are labeled. The cells span columns $C_1$ through $C_{o+1}$, and further span rows $R_k$ through $R_{k+3}$, where o and k are integers respectively representing a column and a row in the memory array 502 of FIG. 5. Further, the cells are electrically coupled to wires (not shown) that are elevated above the cells (when viewed in cross section) by a plurality of contact vias 404. Note that only some of the contact vias 404 are labeled. The boundary cells 124, the SLEG strap cells 402, the CGWL strap cells 406, and the word-line strap cells 410 may, for example, be as their counterparts in FIGS. 1, 2A, 2B, 3A-3C, and 4A-4C are illustrated and/or described.

Figure 6B:
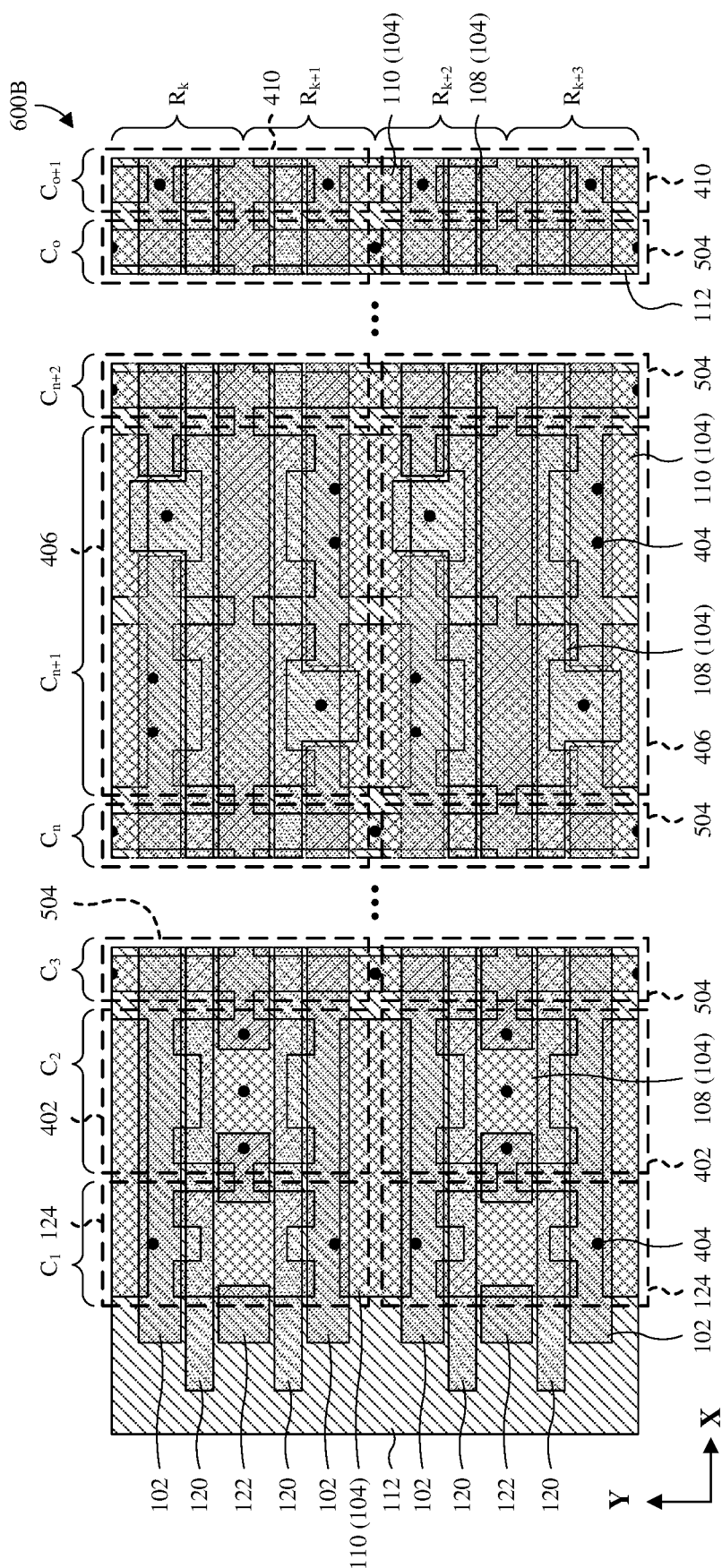

With reference to FIG. 6B, a top layout 600B of some alternative embodiments of integrated memory chip of FIG. 6A is provided in which the boundary cells 124 and the bordering SLEG strap cells 402 share word-line-side device regions 110.

While FIGS. 6A and 6B are illustrated using embodiments of the enhanced device-region layout in FIGS. 1 and 4A-4C, it is to be understood that FIGS. 6A and 6B may alternatively use embodiments of the enhanced device-region layout in any one or combination of FIGS. 3A-3C. For example, the first and second device-region sidewalls 114, 116 in FIGS. 6A and 6B may be curved as illustrated in FIG. 3B or 3C. As another example, the word-line-side device regions 110 in 6A and 6B may be laterally between and spaced from the word lines 102 as illustrated in FIG. 3A.

Figure 7:
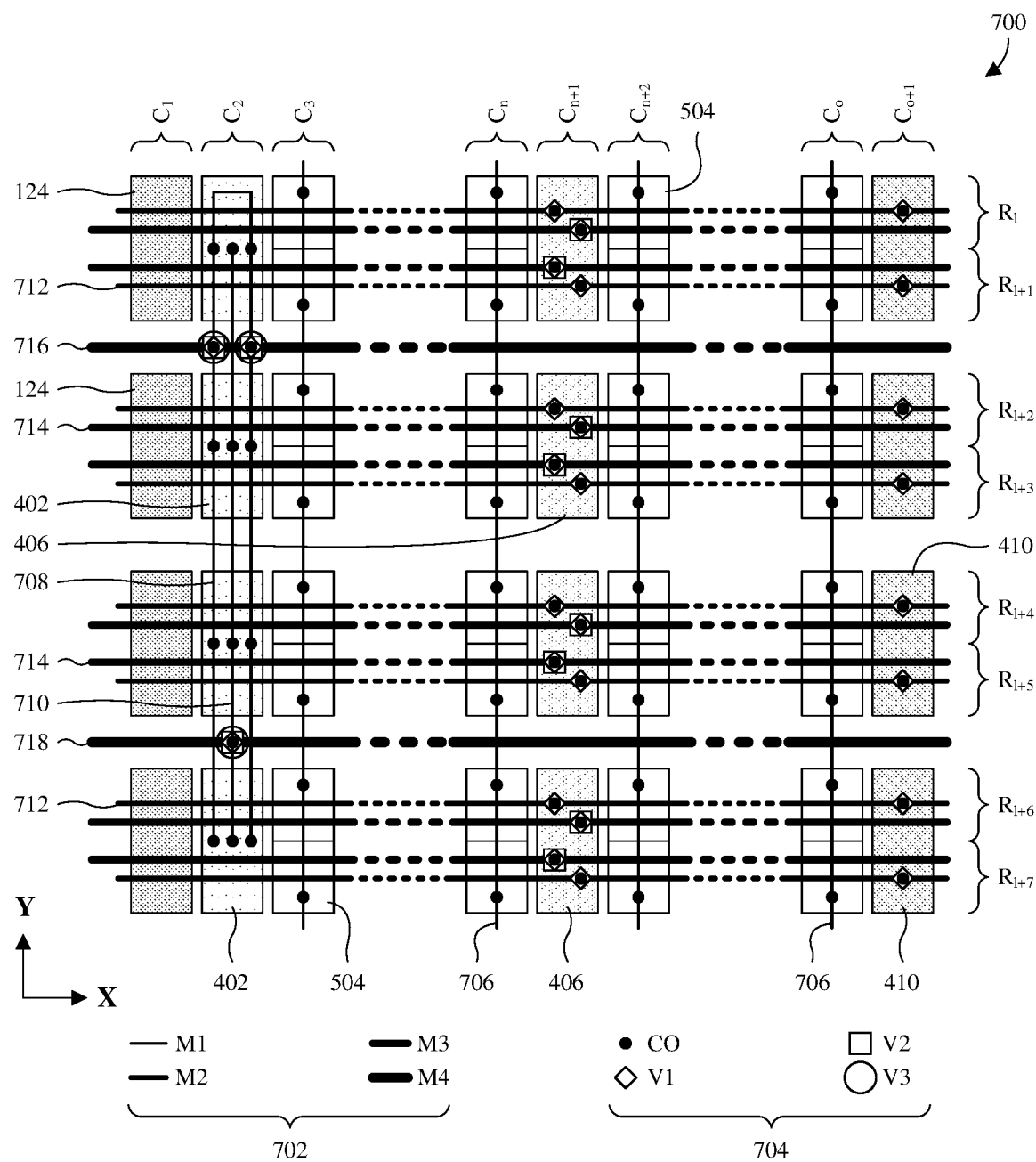
FIG. 7 illustrates a block diagram of some embodiments of an integrated memory chip comprising a boundary portion of the memory array of FIG. 5 in which a plurality of wires and a plurality of vias interconnect cells in the boundary portion.

With reference to FIG. 7, a block diagram 700 of some embodiments of an integrated memory chip comprising a boundary portion of the memory array 502 of FIG. 5 is provided in which a plurality of wires 702 and a plurality of vias 704 interconnect cells in the boundary portion. Note that the wires 702 and the vias 704 are only labeled in the legend below the boundary portion for ease of illustration. The boundary portion may, for example, be taken within box G of FIG. 5 and/or some other like sized boundary portion of FIG. 5. Further, the boundary portion may, for example, correspond to rows $R_l$ through $R_{l+7}$ in the memory array 502 of FIG. 5, where l is an integer representing a row. The cells include boundary cells 124, SLEG strap cells 402, CGWL strap cells 406, word-line strap cells 410, and memory cells 504. Note that only some of each type of cell is labeled.

The wires 702 are grouped into a plurality of wire levels and the vias 704 are grouped into a plurality of via levels. A level corresponds to an elevation above a substrate (see, e.g., the substrate 104 in FIGS. 2A and 2B) on which the boundary portion is arranged when the integrated memory chip is viewed in cross section. The plurality of wire levels comprises a first wire level M1, a second wire level M2, a third wire level M3, and a fourth wire level M4. The wire levels are schematically illustrated by thicknesses of the wires 702 and elevation above the substrate increases with wire thickness. The plurality of via levels comprises a contact via level CO (i.e., a zero via level), a first via level V1, a second via level V2, and a third via level V3.

The via levels are schematically illustrated by shape and/or color. For example, a black circle corresponds vias in the contact via level CO, whereas a white circle corresponds to vias in the third via level V3. As another example, a white diamond and a white square correspond to vias respectively in the first via level V1 and the second via level V2. Vias in the contact via level CO extend from the cells to wires in the first wire level M1, and vias in the first via level V1 extend from wires in the first wire level M1 to wires in the second wire level M2. Further, vias in the second via level V2 extend from wires in the second wire level M2 to wires in the third wire level M3, and vias in the third via level V3 extend from wires in the third wire level M3 to wires in the fourth wire level M4. Note that where vias are at different levels and directly overlap, the intervening wires are not shown for clarity.

The plurality of wires 702 comprises a plurality of bit lines 706, an erase-gate shunt wire 708, and a source-line shunt wire 710 in the first wire level M1. Note that only some of the bit lines 706 are labeled. The bit lines 706 correspond to columns (e.g., columns $C_3$, $C_n$, $C_{n+2}$, and $C_o$) at which the memory cells 504 are located and extend along the corresponding columns. Further, the bit lines 706 electrically couple to memory cells in the corresponding columns through vias in the contact via level CO. The erase-gate shunt wires 708 and the source-line shunt wire 710 correspond to a column (e.g., column $C_2$) at which the SLEG strap cells 402 are located and extend along the column. The erase-gate shunt wire 708 electrically couples to erase gates (not shown) at the SLEG strap cells 402 through vias in the contact via level CO. Similarly, the source-line shunt wire 710 electrically couples to source lines (not shown) at the SLEG strap cells 402 through vias in the contact via level C0.

Additionally, the plurality of wires 702 comprises a plurality of word-line strap lines 712, a plurality of control-gate strap lines 714, an erase-gate strap line 716, and a source-line strap line 718. Note that only some of the word-line strap lines 712 and only some of the control-gate strap lines 714 are labeled. The word-line strap lines 712 are in the second wire level M2. Further, the word-line strap lines 712 extend along corresponding rows and electrically couple to word lines (not shown) in the corresponding rows at the CGWL strap cells 406 and the word-line strap cells 410. Such electrical coupling is through vias in the contact via level C0 and the first via level V1. The control-gate strap lines 714 are in the third wire level M3. Further, the control-gate strap lines 714 extend along corresponding rows and electrically couple to control gates (not shown) in the corresponding rows at the CGWL strap cells 406. Such electrical coupling is through vias in the contact via level C0 and the first and second via levels V1, V2. The erase-gate and source-line strap lines 716, 718 are in the fourth wire level M4 and extend along the rows (e.g., rows $R_{j+1}$ and row $R_{j+5}$). The erase-gate and source-line strap lines 716, 718 respectively electrically couple to the erase-gate and source-line shunt wires 708, 710 through vias in the first, second, and third via levels V1, V2, and V3.

With reference to FIGS. 8-19, a series of cross-sectional views 800-1900 of some embodiments of a method for forming an integrated memory chip comprising a pair of boundary or strap cells with an enhanced device-region layout according to aspects of the present disclosure is provided. The method may be used to form the integrated memory chip(s) from any one or combination of FIGS. 1, 2A, 2B, 3A-3C, 4A-4C, and 5-7. Additionally, the cross-sectional views 800-1900 may, for example, correspond to the cross-sectional view 200A of FIG. 2A at various stages of manufacture and/or may, for example, be taken along line A in FIG. 1, line B in FIG. 3A, line C in FIG. 3B, or line D in FIG. 3C, or any combination of the foregoing.

Figure 8:
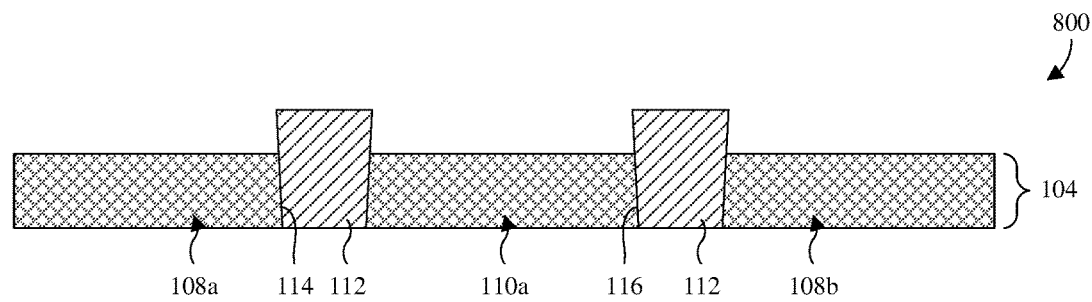
FIGS. 8-19 illustrate a series of cross-sectional views of some embodiments of a method for forming an integrated memory chip comprising a pair of boundary or strap cells with an enhanced device-region layout according to aspects of the present application.

As illustrated by the cross-sectional view 800 of FIG. 8, an isolation structure 112 is formed in a substrate 104, demarcating a first erase-side device region 108a, a second erase-side device region 108b, and a word-line-side device region 110a. The first and second erase-side device regions 108a, 108b, the word-line-side device region 110a, and the isolation structure 112 have top layouts as illustrated in any one or combination of FIGS. 1, 3A-3C, and 4A-4C. Hence, when viewed top down, the first erase-side device region 108a protrudes towards the second erase-side device region 108b and terminates at a first device-region sidewall 114. Similarly, when viewed top down, the second erase-side device region 108b protrudes towards the first erase-side device region 108a and terminates at a second device-region sidewall 116. In some embodiments, the first and second erase-side device regions 108a, 108b are connected outside the cross-sectional view 800. In some of such embodiments, the isolation structure 112 has a top layout as illustrated in FIGS. 6A and/or 6B. Further, in some embodiments, the first and second erase-side device regions 108a, 108b have a combined top layout as illustrated by the erase-side device region 108 of FIGS. 6A and/or 6B.

In some embodiments, a process for forming the isolation structure 112 comprises: 1) depositing a pad oxide layer on the substrate 104; 2) depositing a pad nitride layer on the pad oxide layer; 3) patterning the pad oxide and nitride layers with a layout of the isolation structure 112; 4) performing an etch into the substrate 104 with the pad oxide and nitride layers in place to form isolation openings; 5) filling the isolation openings with a dielectric material; and 6) removing the pad oxide and nitride layers. Other processes are, however, amenable.

Figure 9:
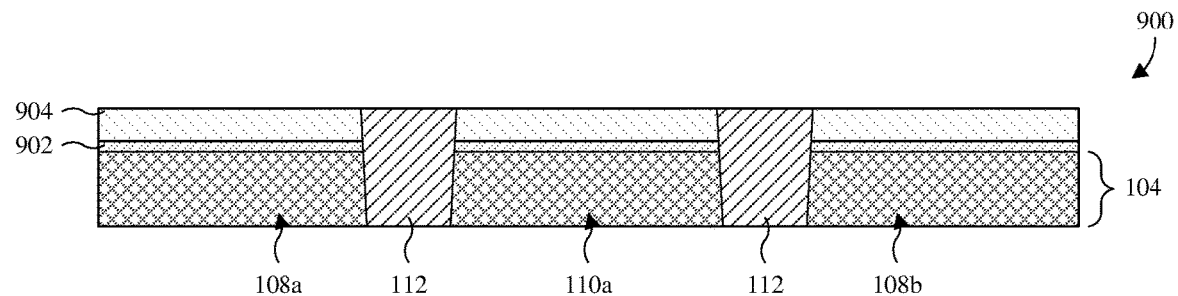

As illustrated by the cross-sectional view 900 of FIG. 9, a first dielectric layer 902 and a first conductive layer 904 (also known as a floating gate layer) are formed stacked on the substrate 104, between segments of the isolation structure 112. A process for forming the first dielectric layer 902 and the first conductive layer 904 may, for example, comprise: 1) depositing the first dielectric layer 902 on the substrate 104; 2) depositing the first conductive layer 904 on the first dielectric layer 902 and the isolation structure 112; and 3) performing a planarization into the first conductive layer 904 until the isolation structure 112 is reached. Other processes are, however, amenable. The depositing of the first dielectric layer 902 may, for example, be performed by thermal oxidation and/or some other suitable deposition process(es). The depositing of the first conductive layer 904 may, for example, be performed by vapor deposition and/or some other suitable deposition process(es).

Figure 10:
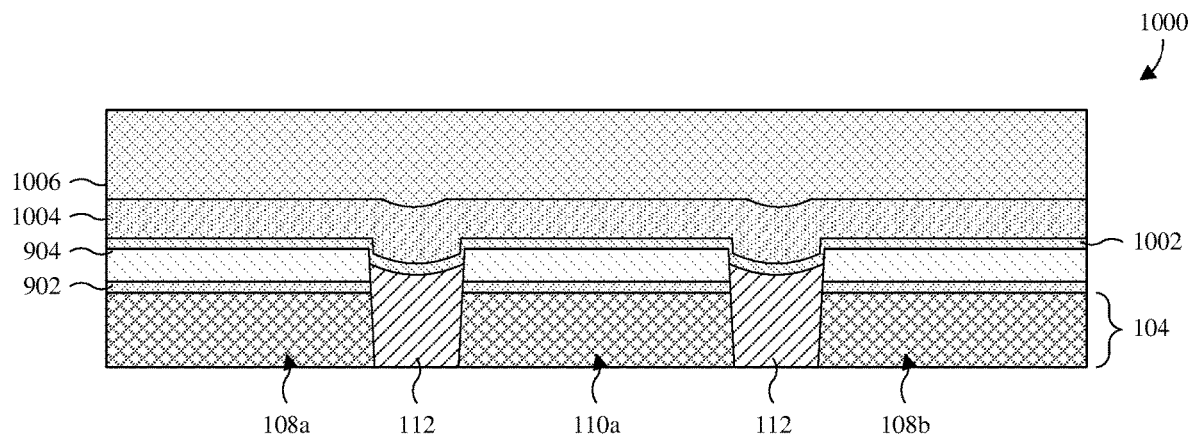

As illustrated by the cross-sectional view 1000 of FIG. 10, an etching process is performed to etch back the isolation structure 112. The etching process may, for example, be performed by a wet etch and/or some other suitable etch. The wet etch may, for example, be performed by applying a solution of hydrofluoric (HF) acid and/or some other suitable solution(s) to the isolation structure 112.

Also illustrated by the cross-sectional view 1000 of FIG. 10, a second dielectric layer 1002, a second conductive layer 1004 (also known as a control gate layer), and a hard mask layer 1006 are formed stacked over the first conductive layer 904 and the isolation structure 112. The second dielectric layer 1002 and the hard mask layer 1006 may, for example, be or comprise silicon oxide, silicon nitride, some other suitable dielectric(s), or any combination of the foregoing. In some embodiments, the second dielectric layer 1002 is or comprises an oxide-nitride-oxide (ONO) film and/or the hard mask layer 1006 is or comprise an ONO film. The second conductive layer 1004 may be or comprise, for example, doped polysilicon and/or some other suitable conductive material(s).

Figure 11:
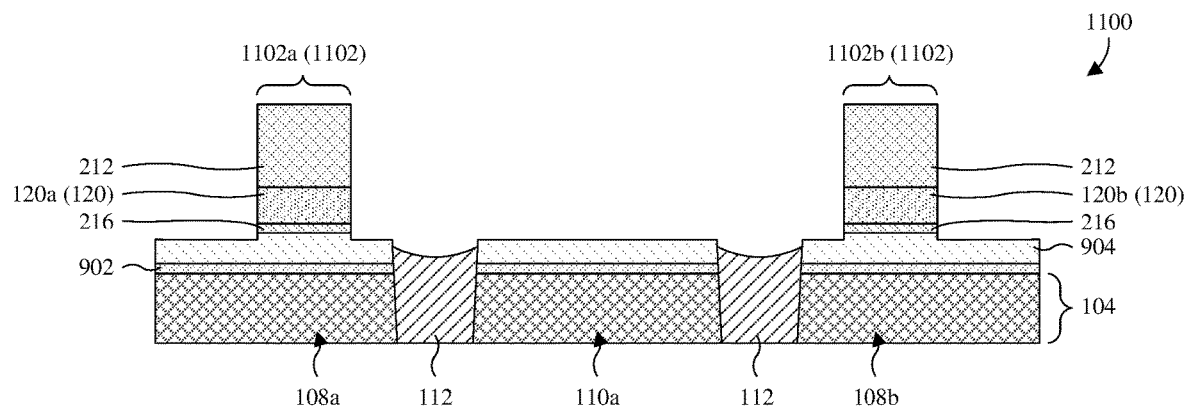

As illustrated by the cross-sectional view 1100 of FIG. 11, a plurality of control-gate stacks 1102 are formed from the second dielectric layer 1002 (see FIG. 10), the second conductive layer 1004 (see FIG. 10), and the hard mask layer 1006 (see FIG. 10). The control-gate stacks 1102 comprise individual control-gate dielectric layers 216, individual control gates 120, and individual control-gate hard masks 212. The control gates 120 respectively overlie the control-gate dielectric layers 216, and the control-gate hard masks 212 respectively overlie the control gates 120. The plurality of control-gate stacks 1102 may, for example, have the same top layout as the plurality of control gates 120 in FIG. 6A and/or FIG. 6B. Other top layouts are, however, amenable.

The plurality of control-gate stacks 1102 comprises a first control-gate stack 1102a and a second control-gate stack 1102b, and the first and second control-gate stacks 1102a, 1102b respectively comprise a first control gate 120a and a second control gate 120b. The first control-gate stack 1102a may, for example, have a top layout as illustrated for the first control gate 120a in any one or combination of FIGS. 1, 3A-3C, and 4A-4C and/or the second control-gate stack 1102b may, for example, have a top layout as illustrated for the second control gate 120b in any one or combination of FIGS. 1, 3A-3C, and 4A-4C. Other top layouts are, however, amenable.

In some embodiments, a process for forming the control-gate stacks 1102 comprises: 1) patterning the hard mask layer 1006 with a control-gate pattern; and 2) performing an etch into the second dielectric layer 1002 and the second conductive layer 1004 with the hard mask layer 1006 in place to transfer the control-gate pattern. Other processes for forming control-gate stacks 1102 are, however, amenable. The patterning may, for example, be performed by a photolithography/etching process or some other suitable patterning process.

Figure 12:
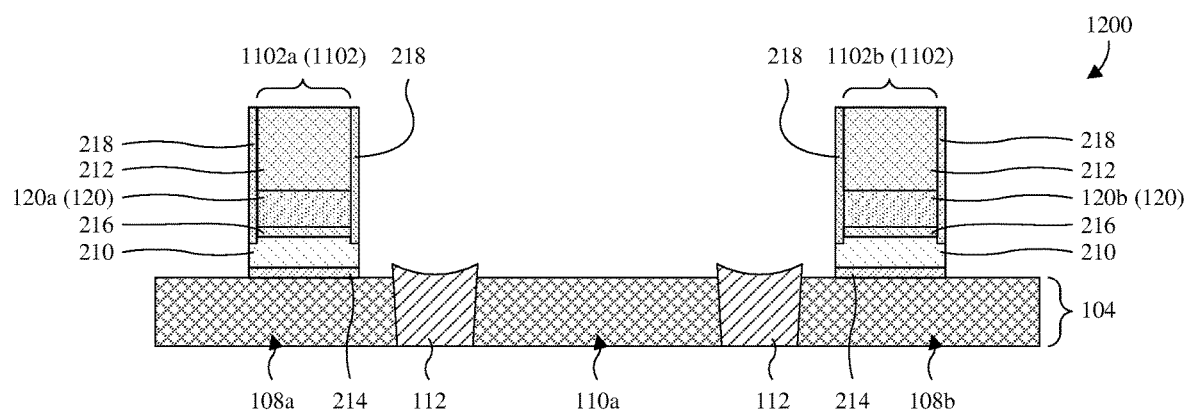

As illustrated by the cross-sectional view 1200 of FIG. 12, control-gate sidewall spacers 218 are formed on sidewalls of the control-gate stacks 1102. The control-gate sidewall spacers 218 may, for example, be or comprise silicon oxide, silicon nitride, some other suitable dielectric(s), or any combination of the foregoing. In some embodiments, the control-gate sidewall spacers 218 are or comprises an ONO film. In some embodiments, a process for forming the control-gate sidewall spacers 218 comprises: 1) depositing a sidewall spacer layer covering and lining the control-gate stacks 1102; and 2) performing an etch back into the sidewall spacer layer. Other processes are, however, amenable.

Also illustrated by the cross-sectional view 1200 of FIG. 12, floating gates 210 and floating-gate dielectric layers 214 are formed from the first conductive layer 904 (see FIG. 11) and the first dielectric layer 902 (see FIG. 11). The floating gates 210 respectively underlie the control gates 120, and the floating-gate dielectric layers 214 respectively underlie the floating gates 210. In some embodiments, a process for forming the floating gates 210 and the floating-gate dielectric layers 214 comprises: 1) performing a first etch into the first conductive layer 904 using the control-gate sidewall spacers 218 and the control-gate hard masks 212 as a mask; and 2) subsequently performing a second etch into the first dielectric layer 902 using the control-gate sidewall spacers 218 and the control-gate hard masks 212 as a mask. Other processes are, however, amenable. In some embodiments, the second etch also etches back the isolation structure 112, and/or is performed by a wet etch and/or some other suitable etch. The wet etch may, for example, be performed by applying a solution of HF acid and/or some other suitable solution(s) to the first dielectric layer 902.

Figure 13:
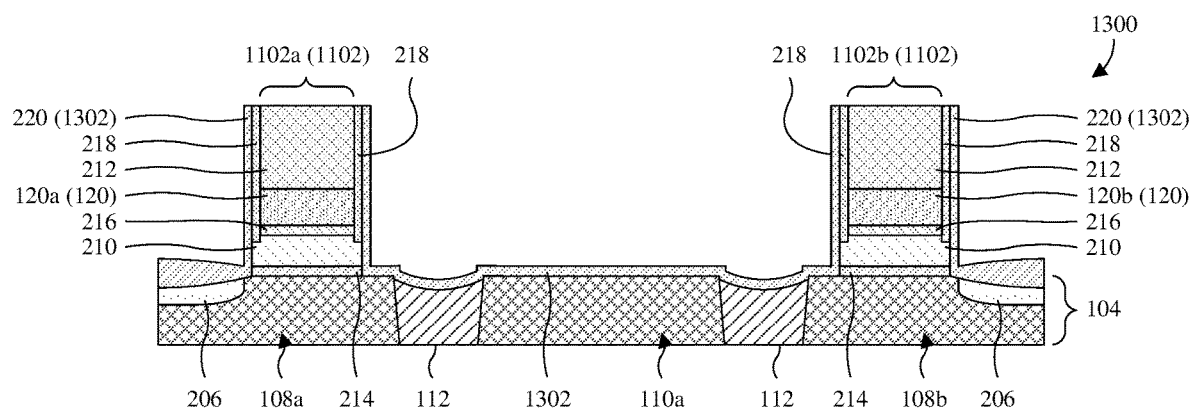

As illustrated by the cross-sectional view 1300 of FIG. 13, a third dielectric layer 1302 (also known as a gate dielectric layer) is formed on sidewalls of the control-gate sidewall spacers 218 and sidewalls of the floating gates 210. Further, the third dielectric layer 1302 is formed lining the substrate 104 and the isolation structure 112 to sides of the control-gate stacks 1102. The third dielectric layer 1302 defines erase-gate dielectric layers 220 along sidewalls of the control-gate stacks 1102 that will border erase gates (not yet formed) and may be or comprise, for example, silicon oxide and/or some other suitable dielectric(s).

A process for forming the third dielectric layer 1302 may, for example, comprise: 1) depositing a first dielectric portion of the third dielectric layer 1302 covering and lining the control-gate stacks 1102; 2) etching back the first dielectric portion; and 3) depositing a second dielectric portion of the third dielectric layer 1302 on the substrate 104. Other processes are, however, amenable. The first dielectric portion may, for example, be formed by vapor deposition and/or some other suitable deposition process(es), and/or the second dielectric portion may, for example, be formed by thermal oxidation and/or some other suitable deposition process(es). In some embodiments, while forming the third dielectric layer 1302, the isolation structure 112 is etched back. For example, the etching back of the first dielectric portion may be performed by a wet etch and/or some other suitable etch that etches back the isolation structure 112. The wet etch may, for example, be performed by applying a solution of HF acid and/or some other suitable solution(s) to the first dielectric portion.

Also illustrated by the cross-sectional view 1300 of FIG. 13, source lines 206 are formed respectively on the first and second erase-side device regions 108a, 108b. The source lines 206 are doped portions of the substrate 104 having an opposite doping type as adjoining portions of the substrate 104. Formation of the source lines 206 may, for example, be performed before, during, or after formation of the third dielectric layer 1302 and/or may, for example, be performed by ion implantation and/or some other suitable doping process(es).

Figure 14:
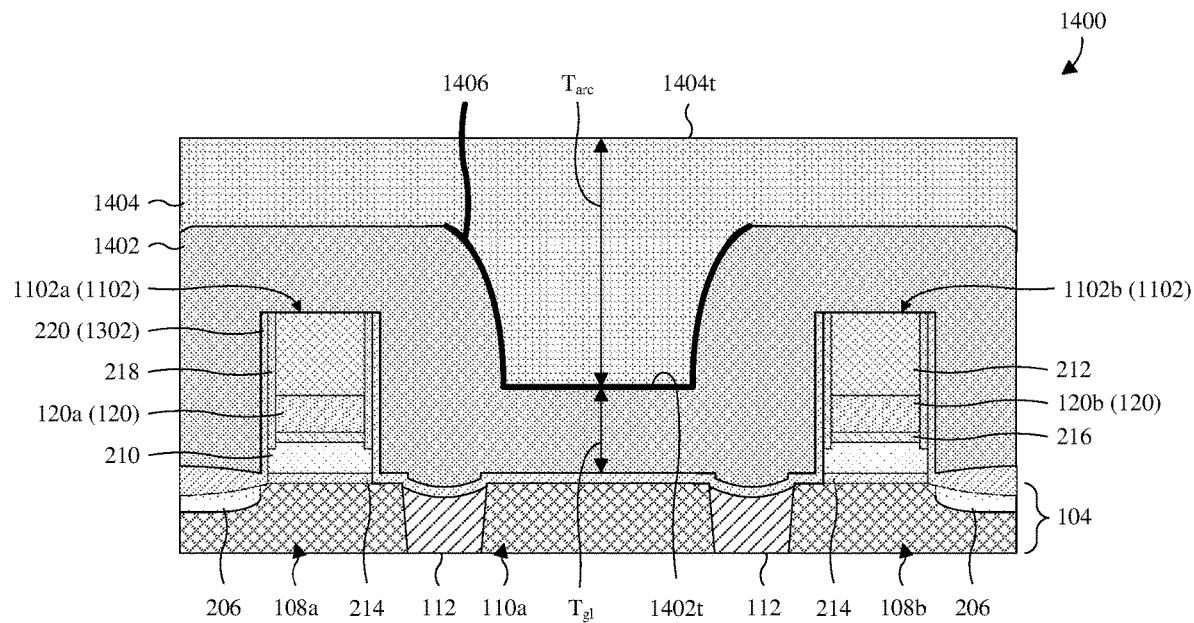

As illustrated by the cross-sectional view 1400 of FIG. 14, a third conductive layer 1402 (also known as a gate layer) and an antireflective layer 1404 are formed stacked over and covering the substrate 104 and the control-gate stacks 1102. The third conductive layer 1402 is indented at sides of the control-gate stacks 1102 due to the drop in elevation from the control-gate stacks 1102 to the spaces between the control-gate stacks 1102. For example, a first indent 1406 (filled by the antireflective layer 1404) forms between the first and second control-gate stacks 1102a, 1102b due to the drop in elevation from the first and second control-gate stacks 1102a, 1102b to the space between the first and second control-gates stacks 1102a, 1102b.

The third conductive layer 1402 has a thickness $T_{gl}$ that is uniform or substantially uniform at the first indent 1406. This may, for example, be due to formation of the third conductive layer 1402 by conformal deposition and/or some other suitable deposition. Further, the third conductive layer 1402 has a top surface 1402t that is planar or substantially planar at the first indent 1406. This may, for example, be because the word-line-side device region 110a has a planar or substantially planar top surface and limits the isolation structure 112 to sides of the first indent 1406. If not for the word-line-side device region 110a, the isolation structure 112 may be directly under the first indent 1406, whereby a top indent of the isolation structure 112 would lead to an indent in the top surface 1402t of the third conductive layer 1402. The third conductive layer 1402 may, for example, be or comprise doped polysilicon and/or some other suitable conductive material. Further, the third conductive layer 1402 may, for example, be formed by vapor deposition and/or some other suitable deposition process(es).

The antireflective layer 1404 has a top surface 1404t that is planar or substantially planar. In some embodiments, a process for forming the antireflective layer 1404 comprises: 1) depositing the antireflective layer 1404 as a flowable material so the top surface 1404t of the antireflective layer 1404 self-levels from the force of gravity; and 2) subsequently curing or hardening antireflective layer 1404. In at least some of such embodiments, the antireflective layer 1404 may, for example, be or comprise a bottom antireflective coating (BARC) material and/or some other suitable antireflective material. In other embodiments, a process for forming the antireflective layer 1404 comprises: 1) depositing the antireflective layer 1404 by vapor deposition and/or some other suitable deposition process(es); and 2) subsequently performing a planarization into the antireflective layer 1404. Other processes for forming the antireflective layer 1404 are, however, amenable. Because the antireflective layer 1404 has a top surface 1404t that is planar or substantially planar, and because the third conductive layer 1402 has a top surface 1402t that is planar or substantially planar at the first indent 1406, the antireflective layer 1404 has a thickness $T_{arc}$ that is uniform or substantially uniform at the first indent 1406. As seen hereafter, this uniform or substantially uniform thickness propagates to subsequent word line etching and leads to uniform or substantially uniform etch loading.

Figure 15:
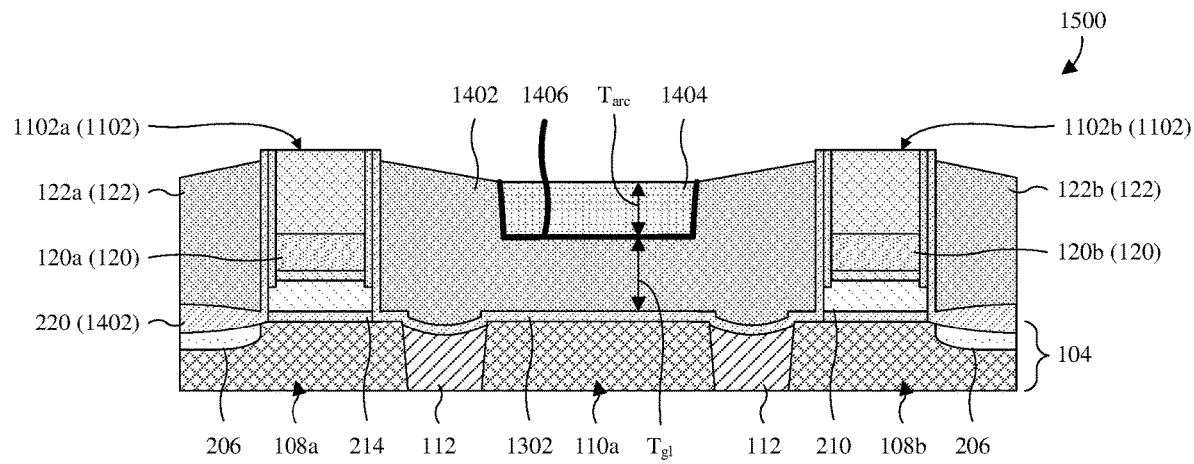

As illustrated by the cross-sectional view 1500 of FIG. 15, top surfaces respectively of the third conductive layer 1402 and the antireflective layer 1404 are recessed to below top surfaces of the control-gate stacks 1102. The recessing forms a plurality of erase gates 122 from the third conductive layer 1402. The plurality of erase gates 122 is on the erase-gate dielectric layers 220 and comprise a first erase gate 122a and a second erase gate 122b respectively on the first and second erase-side device regions 108a, 108b. The erase gates 122 may, for example, have the same top layout as the erase gates 122 in FIG. 6A and/or FIG. 6B. The first and second erase gates 122a, 122b may, for example, have the same top layouts as their counterparts in any one or combination of FIGS. 1, 3A-3C, and 4A-4C. The recessing may, for example, be performed by an etch back and/or some other suitable process(es). The etch back may, for example, comprise: 1) etching the antireflective layer 1404 until the third conductive layer 1402 is uncovered; and 2) simultaneously etching the third conductive layer 1402 and the antireflective layer 1404 until the top surface of the third conductive layer 1402 is recessed to below the top surfaces of the control-gate stacks 1102. In some embodiments, the thickness $T_{arc}$ of the antireflective layer 1404 remains uniform or substantially uniform at the first indent 1406 due to, for example, high uniformity of the etch back and/or the recessing.

Figure 16:
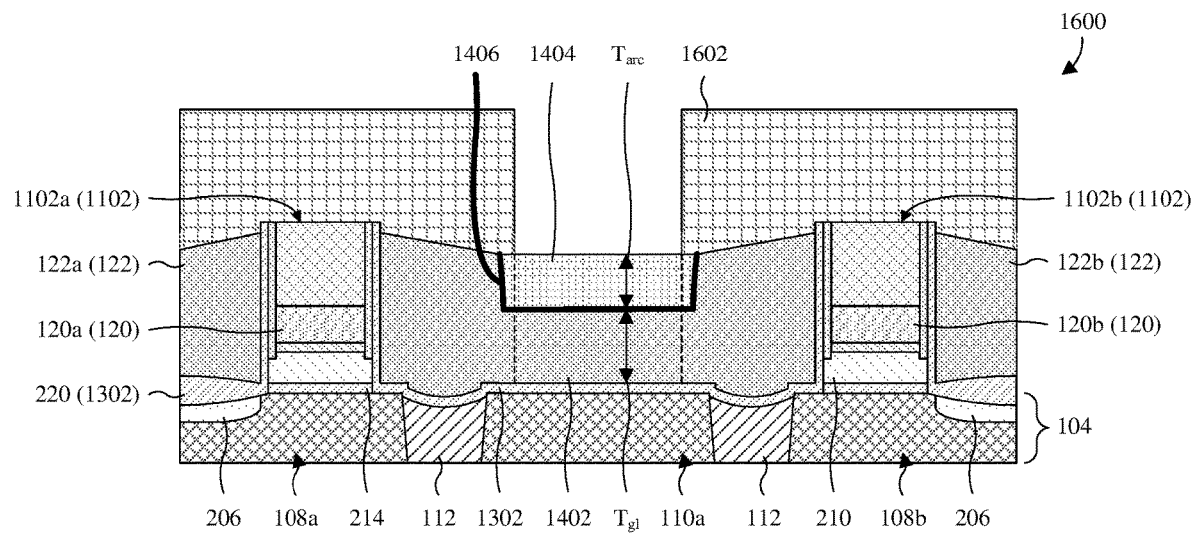

As illustrated by the cross-sectional view 1600 of FIG. 16, a word-line mask 1602 is formed on the control-gate stacks 1102, the third conductive layer 1402, and the antireflective layer 1404. The word-line mask 1602 has a word-line pattern of word lines being formed and may, for example, be or comprise photoresist, a hard mask material, some other suitable mask material(s), or any combination of the foregoing. In some embodiments in which the word-line mask 1602 is or comprise photoresist, the antireflective layer 1404 may aid in accurately forming the word-line pattern in the word-line mask 1602 by preventing or reducing light reflection during exposure of the photoresist to radiation.

Figure 17:
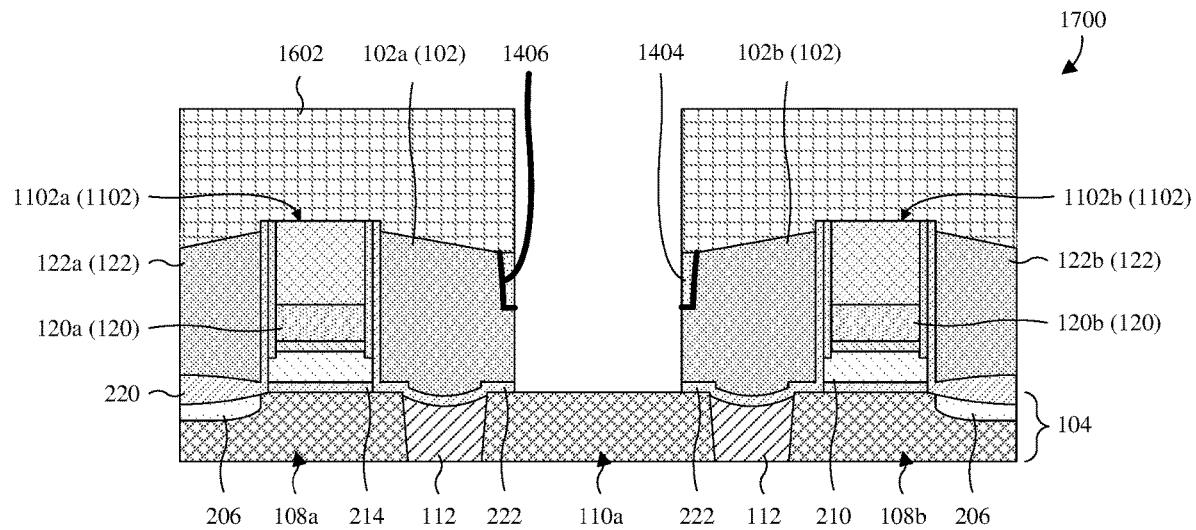

As illustrated by the cross-sectional view 1700 of FIG. 17, an etch is performed into the third dielectric layer 1302 (see FIG. 16), and the third conductive layer 1402 (see FIG. 16), and the antireflective layer 1404. The etch transfers the word-line pattern from the word-line mask 1602 to the third conductive layer 1402 and the third dielectric layer 1302, thereby forming a plurality of word lines 102 and a plurality of word-line dielectric layers 222. The word lines 102 are formed along sidewalls of the control-gate stacks 1102, and the word-line dielectric layers 222 line the word lines 102. The plurality of word lines 102 comprise a first word line 102a and a second word line 102b respectively along the first and second control-gate stacks 1102a, 1102b. The word lines 102 may, for example, have the same top layout as the plurality of word lines 102 in FIG. 6A and/or FIG. 6B. The first and second word lines 102a, 102b may, for example, have the same top layouts as their counterparts in any one or combination of FIGS. 1, 3A-3C, and 4A-4C. Other top layouts are, however, amenable.

As seen through comparison of FIGS. 16 and 17, the word-line pattern is such that the etch removes portions of the third conductive layer 1402 and portions of the antireflective layer 1404 at the first indent 1406. Because these removed portions have uniform or substantially uniform thickness $T_{arc}$, $T_{gl}$, as described above, the etch has uniform or substantially uniform etch loading at the first indent 1406. The uniform or substantially uniform etch loading reduces the likelihood of etch residue. Because etch residue has the potential to electrically short the first and second word lines 102a, 102b together, and the likelihood of etch residue is reduced, the likelihood of etch residue electrically shorting the first and second word lines 102a, 102b together is reduced. This, in turn, enlarges the process window (e.g., resiliency) of the etch and hence leads to increases yields.

Figure 18:
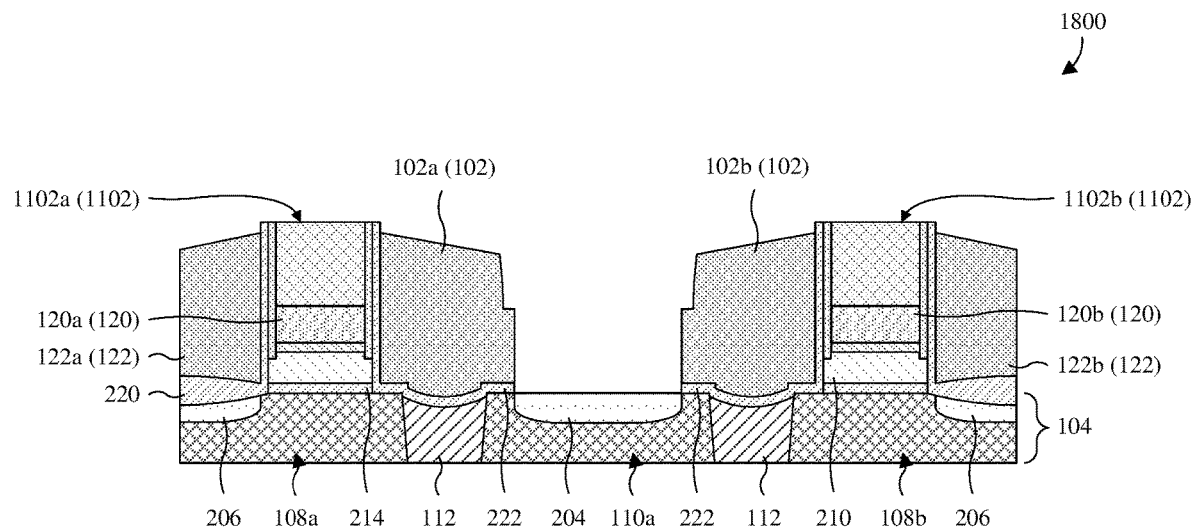

As illustrated by the cross-sectional view 1800 of FIG. 18, the antireflective layer 1404 (see FIG. 17) is removed. Further, the word-line mask 1602 (see FIG. 17) is fully or partially removed. For example, where the word-line mask 1602 is or comprises photoresist, the photoresist may be fully removed. The removing may, for example, be performed by plasma ashing and/or some other suitable removal process(es).

Also illustrated by the cross-sectional view 1800 of FIG. 18, a source/drain region 204 is formed on the word-line-side device region 110a, between the first and second word lines 102a, 102b. The source/drain region 204 may, for example, be a doped region of the substrate 104 having an opposite doping type as an adjoining region of the substrate 104.

Figure 19:
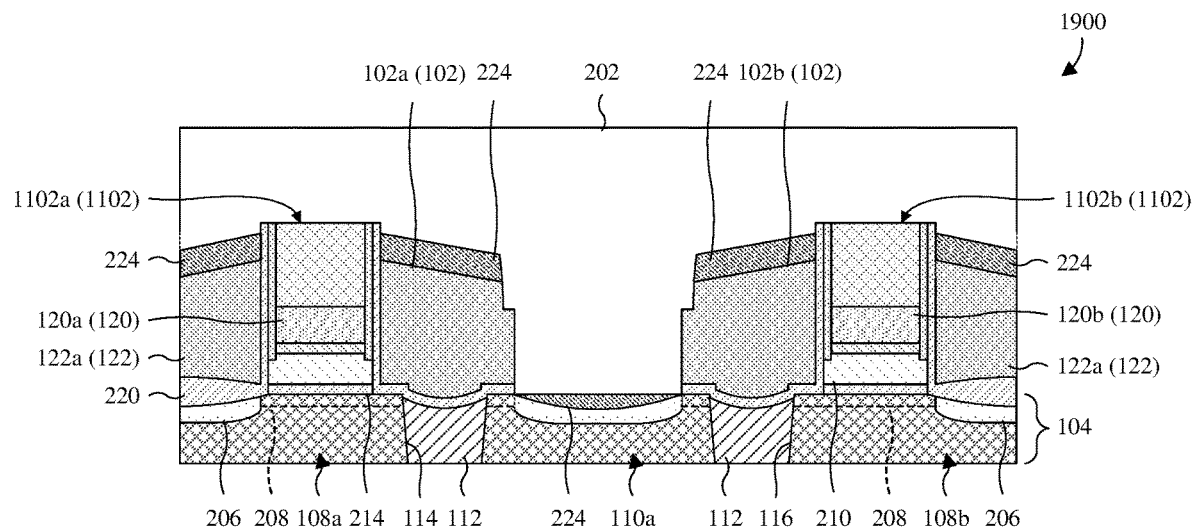

As illustrated by the cross-sectional view 1900 of FIG. 19, silicide layers 224 are formed respectively covering the first and second word lines 102a, 102b, the first and second erase gates 122a, 122b, and the source/drain region 204. The silicide layers 224 may, for example, be or comprise nickel silicide and/or some other suitable silicide.

As described above, the isolation structure 112 is subject to recessing during etching and/or cleaning processes. For example, the acts at FIGS. 10, 12, and 13 may lead to such recessing. The recessing may be of such an extent that the first and second device-region sidewalls 114, 116 of the first and second erase-side device regions 108a, 108b become exposed. Because the word lines 102 overlie the isolation structure 112 and cover the first and second device-region sidewalls 114, 116, the first and second device-region sidewalls 114, 116 are not exposed during formation of the silicide layers 224. Hence, silicide does not form on the first and second device-region sidewalls 114, 116.

If silicide formed on the first and second device-region sidewalls 114, 116, leakage paths could extend from a bulk of the substrate 104, along the of the first and second erase-side device regions 108a, 108b, to the source lines 206. For example, the leakage paths could extend from the bulk of the substrate 104, along the of the first and second erase-side device regions 108a, 108b, to selectively-conductive channels 208 underlying the first and second word lines 102a, 102b. Further, the leakage paths could extend along the selectively-conductive channels 208 to the source lines 206 if the first and second word lines 102a, 102b and the first and second control gates 120a, 120b were appropriately biased. If the leakage paths extended from the bulk of the substrate 104, along the of the first and second erase-side device regions 108a, 108b, to the source lines 206, memory cells may undergo read and/or write disturbances that potentially lead to failure. Accordingly, forming the word lines 102 covering the of the first and second erase-side device regions 108a, 108b may prevent source line leakage paths and may enhance yields.

Also illustrated by the cross-sectional view 1900 of FIG. 19, an interconnect dielectric layer 202 is formed covering the word lines 102, the control-gate stacks 1102, and the erase gates 122. In some embodiments, a plurality of wires (not shown) and a plurality of vias (not shown) are formed in the interconnect dielectric layer 202.

While FIGS. 8-19 are described with reference to a method, it will be appreciated that the structures shown in FIGS. 8-19 are not limited to the method but rather may stand alone separate of the method. Further, while FIGS. 8-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 20:
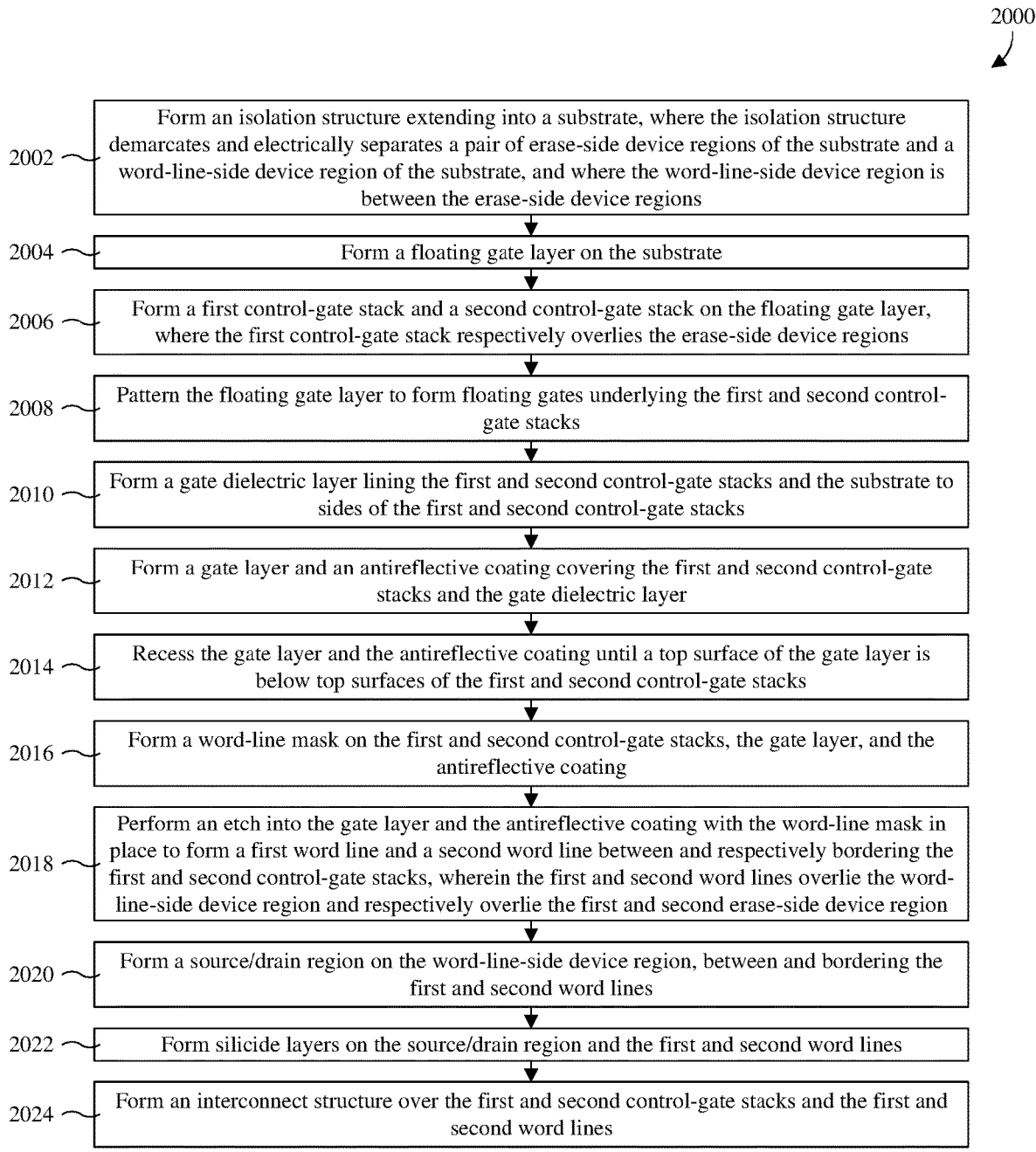
FIG. 20 is a block diagram of some embodiments of the method of FIGS. 8-19.

With reference to FIG. 20, a block diagram 2000 of some embodiments of the method of FIGS. 8-19 is provided.

At 2002, an isolation structure is formed extending into a substrate. The isolation structure demarcates and electrically separates a pair of erase-side device regions of the substrate and a word-line-side device region of the substrate. Further, the word-line-side device region is between and borders the erase-side device regions. See, for example, FIG. 8. In some embodiments, the erase-side device regions are independent of each other. In other embodiments, the erase-side device regions are one and the same.

At 2004, a floating gate layer is formed on the substrate. See, for example, FIG. 9.

At 2006, a first control-gate stack and a second control-gate stack are formed on the floating gate layer, respectively overlying the erase-side device regions. See, for example, FIGS. 10 and 11.

At 2008, the floating gate layer is patterned to form floating gates underlying the first and second control-gate stacks. See, for example, FIG. 12.

At 2010, a gate dielectric layer is formed lining the first and second control-gate stacks and the substrate to sides of the first and second control-gate stacks. See, for example, FIG. 13.

At 2012, a gate layer and an antireflective coating are formed covering the first and second control-gate stacks and the gate dielectric layer. See, for example, FIG. 14.

At 2014, the gate layer and the antireflective coating are recessed until a top surface of the gate layer is below top surfaces of the first and second control-gate stacks. See, for example, FIG. 15.

At 2016, a word-line mask is formed on the first and second control-gate stacks, the gate layer, and the antireflective coating. See, for example, FIG. 16.

At 2018, an etch is performed into the gate layer and the antireflective coating with the word-line mask in place to form a first word line and a second word line between and respectively bordering the first and second control-gate stacks. The first and second word lines overlie the word-line-side device region and respectively overlie the first and second erase-side device region. See, for example, FIG. 17.

At 2020, a source/drain region is formed on the word-line-side device region, between and bordering the first and second word lines. See, for example, FIG. 18

At 2022, silicide layers are formed on the source/drain region and the first and second word lines. See, for example, FIG. 18.

At 2024, an interconnect structure is formed over the first and second control-gate stacks and the first and second word lines. See, for example, FIG. 19.

While the block diagram 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a substrate including a first device region, and further including a device-region sidewall at an edge of the first device region; an isolation structure in the substrate, wherein the isolation structure surrounds and demarcates the first device region, and further adjoins the device-region sidewall; and an erase gate, a control gate, and a word line on the first device region and spaced from each other in a first direction, wherein the control gate is between and borders the erase gate and the word line, and wherein the device-region sidewall extends laterally in a second direction transverse to the first direction and underlies the word line. In some embodiments, the substrate further includes a second device region, wherein the isolation structure extends in a closed path to completely surround and demarcate the second device region, and wherein the word line overlies the second device region. In some embodiments, the substrate further includes a first source/drain region and a second source/drain region respectively on the first and second device regions, wherein the first source/drain region underlies the erase gate, and wherein the second source/drain region borders the word line. In some embodiments, the first device region is elongated in the second direction, wherein the first device region protrudes in the first direction to the first device-region sidewall. In some embodiments, the first device region has an H-shaped portion underlying the erase gate, the control gate, and the word line. In some embodiments, a bottom surface of the word line protrudes into the isolation structure to below a top surface of the substrate.

In some embodiments, the present application provides another an integrated chip including: a substrate including a first source/drain region; a control gate and a word line on the substrate, wherein the word line is between and borders the first source/drain region and the control gate, and wherein the word line is elongated along a length of the word line; and an isolation structure extending into the substrate and having a first isolation-structure sidewall, wherein the first isolation-structure sidewall extends laterally along the length of the word line and underlies the word line. In some embodiments, the isolation structure further has a second isolation-structure sidewall, wherein the second isolation-structure sidewall extends laterally along the length of the word line, and wherein the second isolation-structure sidewall is between the first source/drain region and the first isolation-structure sidewall. In some embodiments, the second isolation-structure sidewall is directly under the word line. In some embodiments, a top surface of the isolation structure arcs continuously from the first isolation-structure sidewall to the second isolation-structure sidewall. In some embodiments, the isolation structure extends laterally in a closed path to completely enclose the first source/drain region. In some embodiments, the word line has a word-line sidewall bordering the first source/drain region and elongated along the length of the word line, wherein the word-line sidewall is offset from the first isolation-structure sidewall by at least 10 nanometers. In some embodiments, the substrate further includes a second source/drain region bordering the control gate on an opposite side of the control gate as the word line. In some embodiments, the isolation structure has a second isolation-structure sidewall extending transverse to the length of the word line, from the first isolation-structure sidewall to the second source/drain region.

In some embodiments, the present application provides a method for forming an integrated chip, the method including: forming an isolation structure extending into a substrate, wherein the isolation structure demarcates and electrically separates a first device region of the substrate and a second device region of the substrate; forming a control gate stack on the first device region; depositing a gate layer covering the control gate stack, the isolation structure, and the first and second device regions; and patterning the gate layer to form a word line bordering the control gate stack, wherein the word line overlies the isolation structure and the first and second device regions. In some embodiments, the patterning includes: etching back the gate layer until a top surface of the gate layer is below a top surface of the control gate stack; and performing an etch into the gate layer to form a word-line pattern in the gate layer. In some embodiments, the isolation structure has a pair of isolation-structure sidewalls, wherein the isolation-structure sidewalls have substantially the same lateral orientation and respectively adjoin the first and second device regions, and wherein the word line is formed directly over the isolation-structure sidewalls. In some embodiments, the patterning further forms an erase gate bordering the control gate stack on an opposite side of the control gate stack as the word line. In some embodiments, the method further includes: doping the first device region to form a first source/drain region bordering the control gate stack; and doping the second device region to form a second source/drain region bordering the word line. In some embodiments, the isolation structure has a first isolation-structure sidewall and a second isolation-structure sidewall, wherein the first and second isolation-structure sidewalls are on opposite sides of the second device region and adjoin the second device region, and wherein the gate layer has a planar profile from the first isolation-structure sidewall to the second isolation-structure sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a first source/drain region and a second source/drain region in the substrate;
   an erase gate, a control gate, and a word line overlying the substrate, wherein the erase gate overlies the first source/drain region, wherein the word line borders the second source/drain region, and wherein the control gate is between and borders the erase gate and the word line; and
   a trench isolation structure extending into the substrate, wherein the trench isolation structure is between the first and second source/drain regions, and is closer to the second source/drain region than the first source/drain region, along an axis.

2. The integrated chip according to claim 1, wherein the trench isolation structure is spaced from the first and second source/drain regions.

3. The integrated chip according to claim 1, wherein the erase gate, the control gate, and the word line are elongated in parallel in a direction transverse to the axis.

4. The integrated chip according to claim 1, wherein the trench isolation structure has a first sidewall and a second sidewall both underlying the word line and respectively facing in opposite directions along the axis, and wherein the trench isolation structure is continuous along the axis from the first sidewall to the second sidewall.

5. The integrated chip according to claim 4, wherein the trench isolation structure has a third sidewall underlying the control gate and facing a same direction as the second sidewall, and wherein the trench isolation structure is continuous along a second axis parallel with the axis from the first sidewall to the third sidewall.

6. The integrated chip according to claim 1, wherein the trench isolation structure underlies the word line, but not the control gate, along the axis.

7. The integrated chip according to claim 1, wherein the axis overlaps with a portion of the trench isolation structure having a T-shaped top geometry.

8. An integrated chip comprising:
   a substrate;
   a pair of erase gates over the substrate;
   a pair of control gates over the substrate, wherein the control gates are between and respectively border the erase gates;
   a pair of word lines over the substrate, wherein the word lines are between and respectively border the control gates;
   a source/drain region in the substrate, wherein the source/drain region is between and borders the word lines; and
   a trench isolation structure in the substrate and extending in a closed path around the source/drain region, wherein the closed path is localized between the control gates.

9. The integrated chip according to claim 8, wherein the closed path repeats along a length of the word lines.

10. The integrated chip according to claim 8, wherein the closed path demarcates a device region of the substrate having a rectangular top geometry.

11. The integrated chip according to claim 8, wherein the closed path is localized between the word lines.

12. The integrated chip according to claim 8, wherein the substrate has a pair of sidewalls adjoining the closed path, and wherein the sidewalls respectively face opposite directions transverse to a length of the word lines.

13. The integrated chip according to claim 12, wherein the sidewalls respectively underlie the word lines.

14. The integrated chip according to claim 8, wherein the pair of control gates comprises a first control gate with a sidewall protrusion that overlaps with the closed path, and wherein the sidewall protrusion forms a contact pad.

15. An integrated chip comprising:
   a substrate; and an erase gate, a control gate, and a word line overlying the substrate and laterally elongated in parallel in a first direction, wherein the control gate is between and borders the erase gate and the word line, and wherein the control gate and the word line respectively have a control-gate sidewall and a word-line sidewall facing away from the erase gate;

wherein the substrate has a substrate sidewall that faces in a second direction transverse to the first direction and that is laterally offset from and between the word-line and control-gate sidewalls, and wherein the second direction extends away from the erase gate.

16. The integrated chip according to claim 15, wherein the substrate sidewall underlies the word line.

17. The integrated chip according to claim 15, further comprising:
a floating gate underlying the control gate, wherein the floating gate has a floating-gate sidewall facing away from the erase gate, and wherein the substrate sidewall is laterally offset from and between the word-line and floating-gate sidewalls.

18. The integrated chip according to claim 15, further comprising:
a trench isolation structure extending into the substrate and demarcating an H-shaped portion of the substrate that repeats along a length of the erase gate;
wherein the substrate sidewall is a sidewall of the H-shaped portion.

19. The integrated chip according to claim 15, wherein the erase gate has a first erase-gate segment and a second erase-gate segment separated by a gap in the first direction, and wherein the control-gate sidewall, the word-line sidewall, the gap, and the substrate sidewall overlap with a common axis extending transverse to the first direction.

20. The integrated chip according to claim 15, wherein the substrate has a second substrate sidewall that faces the substrate sidewall and underlies the word line, and wherein a contact via overlies and extends from the word line at a location laterally between the substrate sidewall and the second substrate sidewall.

* * * * *